United States Patent
Yamada

(10) Patent No.: US 12,429,629 B2
(45) Date of Patent: Sep. 30, 2025

(54) PROJECTOR

(71) Applicant: SEIKO EPSON CORPORATION, Tokyo (JP)

(72) Inventor: Fumika Yamada, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 349 days.

(21) Appl. No.: 18/085,994

(22) Filed: Dec. 21, 2022

(65) Prior Publication Data
US 2023/0194758 A1  Jun. 22, 2023

(30) Foreign Application Priority Data
Dec. 22, 2021 (JP) ................. 2021-207919

(51) Int. Cl.
| | |
|---|---|
| *G02B 1/00* | (2006.01) |
| *G03B 21/14* | (2006.01) |
| *G03B 21/28* | (2006.01) |
| *G03F 7/00* | (2006.01) |
| *G02B 27/10* | (2006.01) |

(52) U.S. Cl.
CPC .......... *G02B 1/002* (2013.01); *G03B 21/142* (2013.01); *G03B 21/28* (2013.01); *G03F 7/0005* (2013.01); *G02B 27/1006* (2013.01); *G02F 2202/30* (2013.01)

(58) Field of Classification Search
CPC .. G02B 1/002; G02B 27/1006; G03B 21/142; G03B 21/28; G03F 7/0005; G02F 2202/30

USPC ......................................................... 359/642
See application file for complete search history.

(56) References Cited

U.S. PATENT DOCUMENTS

| | | | |
|---|---|---|---|
| 10,620,512 B2 | 4/2020 | Shishido | |
| 11,048,153 B2 | 6/2021 | Yamada | |
| 11,317,066 B2 | 4/2022 | Yamada | |
| 2016/0306079 A1 | 10/2016 | Arbabi et al. | |
| 2018/0246398 A1 | 8/2018 | Shishido | |
| 2018/0341090 A1 | 11/2018 | Devlin et al. | |
| 2019/0041660 A1 | 2/2019 | Ahmed | |
| 2019/0064532 A1 | 2/2019 | Riley, Jr. et al. | |
| 2019/0139243 A1 | 5/2019 | You et al. | |
| 2019/0154877 A1 | 5/2019 | Capasso et al. | |
| 2020/0124950 A1 | 4/2020 | Yamada | |
| 2021/0099681 A1 | 4/2021 | Yamada | |

FOREIGN PATENT DOCUMENTS

| | | |
|---|---|---|
| CN | 108508682 A | 9/2018 |
| CN | 111427105 A | 7/2020 |
| JP | 2011-059265 A | 3/2011 |
| JP | 5317288 B2 | 10/2013 |
| JP | 2018-536204 A | 12/2018 |
| JP | 2019-516128 A | 6/2019 |
| JP | 2020-064174 A | 4/2020 |
| JP | 2020-190616 A | 11/2020 |

(Continued)

*Primary Examiner* — William Choi
(74) *Attorney, Agent, or Firm* — Oliff PLC

(57) ABSTRACT

A projector of the present disclosure includes a light source that emits laser light, a metasurface element that modulates the phase of the laser light emitted from the light source, and a light modulation element that modulates the phase-modulated laser light emitted from the metasurface element to generate projection light.

14 Claims, 13 Drawing Sheets

(56) References Cited

FOREIGN PATENT DOCUMENTS

| JP | 2020-537193 A | 12/2020 | |
| JP | 2021-056370 A | 4/2021 | |
| WO | WO-2021261100 A1 * | 12/2021 | ......... G02B 27/0093 |

* cited by examiner

PROJECTOR

The present application is based on, and claims priority from JP Application Serial Number 2021-207919, filed Dec. 22, 2021, the disclosure of which is hereby incorporated by reference herein in its entirety.

BACKGROUND

1. Technical Field

The present disclosure relates to a projector.

2. Related Art

In recent years, semiconductor lasers (laser diodes (LDs)) having advantages such as high brightness, long life, and a narrow radiation angle have been used as light sources for image display devices such as projectors. When an LD is used as a light source, such advantages can be achieved, but due to the influence of its higher coherence than general white light sources or the like, laser light projected and scattered on a screen of an image display device interferes on the retina of an observer, causing speckle noise.

For example, JP-A-2011-059265 discloses an apparatus including a light source that emits coherent light. The apparatus disclosed in JP-A-2011-059265 further includes a projection optical unit that projects light from the light source onto a screen, an image forming device that modulates the coherent light to form an image, and a phase modulation unit that modulates the phase of the coherent light. The image forming device and the phase modulation unit are arranged between the light source and the projection optical unit. The phase modulation unit includes a driving unit that changes interference fringes, which are caused as coherent light beams transmitted, for example, through a high refractive index portion and a low refractive index portion interfere on the screen, more quickly than the human eye can see them.

An aspect of the phase modulation unit of the apparatus disclosed in JP-A-2011-059265 has a cylindrical body and a rotation axis connected to the center of the body. The cylindrical body is made of a low refractive index material and particles distributed on the sides of the body are made of a high refractive index material having a higher refractive index than the low refractive index material. However, disposing the phase modulation unit between the light source and the projection optical unit such that the axis core of the body and the rotation axis cross the optical path of coherent light to reduce speckle noise on the screen requires an installation space that is at least wider than the diameter of a bottom surface of the body, which may cause an increase in the overall size of the apparatus.

SUMMARY

To solve the above problem, a projector according to an aspect of the present disclosure includes a light source, a metasurface element configured to modulate a phase of light emitted from the light source, and a light modulation element configured to modulate the phase-modulated light emitted from the metasurface element to generate image light.

DESCRIPTION OF EXEMPLARY EMBODIMENTS

First Embodiment

Figure 1:
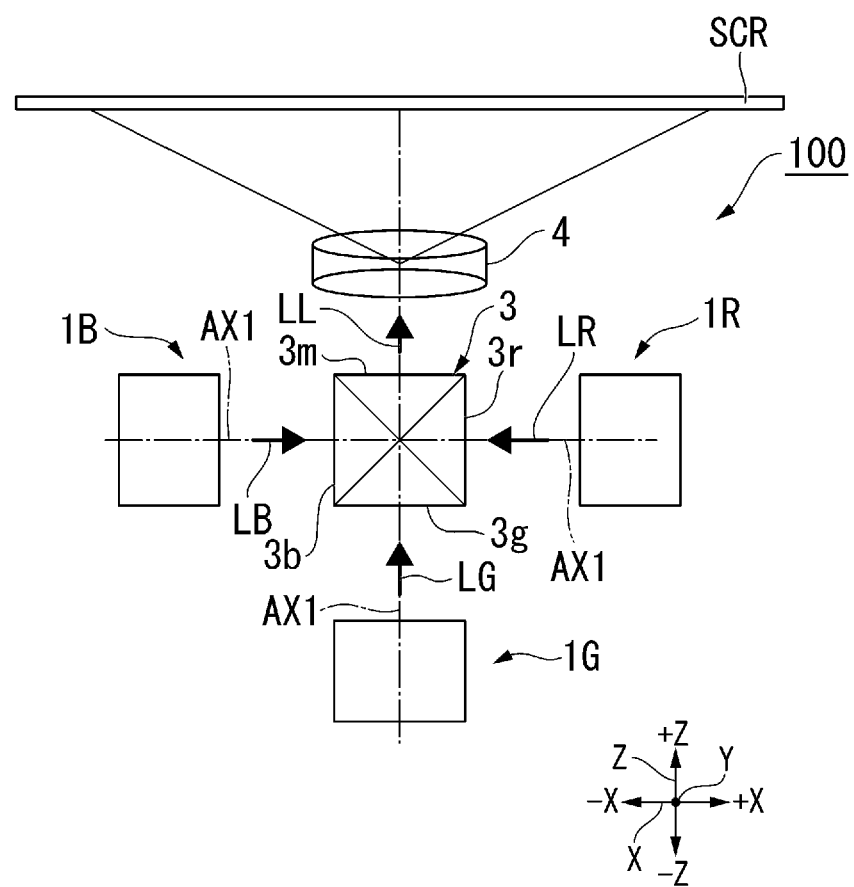
FIG. 1 is a schematic configuration diagram of a projector according to a first embodiment.

A first embodiment of the present disclosure will be described below with reference to FIGS. 1 to 8B.
Projector FIG. 1 is a schematic configuration diagram of a projector 100 of the first embodiment. In each of the following drawings, the scale of dimensions may be changed depending on constituent elements in order to make the constituent elements easier to see.

As shown in FIG. 1, the projector 100 is a projection-type image display device that projects an image onto a screen SCR. The projector 100 includes three light source modules, that is, a first light source module 1R for red, a second light source module 1G for green, and a third light source module 1B for blue, a cross dichroic prism 3, and a projection optical system (a projection device) 4.

The first light source module 1R emits red image light LR. The second light source module 1G emits green image light LG. The third light source module 1B emits blue image light LB. The first to third light source modules 1R, 1G, and 1B form red, green, and blue image light LR, LG, and LB according to information on pixels corresponding to the respective optical systems in an image to be displayed by the projector 100.

The image light LR, LG, and LB emitted from the first to third light source modules 1R, 1G, and 1B are incident on the cross dichroic prism 3. The cross dichroic prism 3 combines and guides the image light LR, LG, and LB to the projection optical system 4. The projection optical system 4 magnifies an image formed by the first to third light source modules 1R, 1G, and 1B and projects the image onto the screen SCR. The projection optical system 4 includes one or more projection lenses.

The cross dichroic prism 3 is formed by bonding four right angle prisms together and includes a dielectric multilayer film that reflects red light and a dielectric multilayer film that reflects blue light. The dielectric multilayer films combine the three-color image light LR, LG, and LB to form light LL representing a color image.

In the following, a direction parallel to the optical axis of the light LL emitted from the cross dichroic prism 3 is referred to as a Z direction, the front side in the traveling direction of the light LL which is the Z direction is referred to as a +Z side, and the side opposite to the +Z side in the Z direction is referred to as a −Z side. A direction perpendicular to the Z direction is referred to as an X direction, one side in the X direction is referred to as a +X side, and the other side in the X direction is referred to as a −X side. A direction perpendicular to both the X and Z directions is referred to as a Y direction, one side in the Y direction is referred to as a +Y side, and the other side in the Y direction is referred to as a −Y side.

Interfaces between the right angle prisms of the cross dichroic prism 3 are formed in a cross shape when viewed in the Y direction. A dielectric multilayer film that reflects the blue image light LB and transmits the green image light LG and the red image light LR is disposed at the interface that goes from the −X side to the +X side as it goes from the −Z side to the +Z side. A dielectric multilayer film that reflects the red image light LR and transmits the green image light LG and the blue image light LB is disposed at the interface that goes from the +X side to the −X side as it goes from the −Z side to the +Z side.

The third light source module 1B is disposed to face a side surface 3b on the −X side of the cross dichroic prism 3, which is parallel to the Z direction, in the X direction and is disposed on the −X side of the cross dichroic prism 3. The image light LB emitted from the third light source module 1B is incident on the side surface 3b of the cross dichroic prism 3 through the −X side in a direction parallel to the X direction.

The first light source module 1R is disposed to face a side surface 3r on the +X side of the cross dichroic prism 3, which is parallel to the Z direction, in the X direction and is disposed on the +X side of the cross dichroic prism 3. The image light LR emitted from the first light source module 1R is incident on the side surface 3r of the cross dichroic prism 3 through the +X side in a direction parallel to the X direction.

The second light source module 1G is disposed to face a side surface 3g on the −Z side of the cross dichroic prism 3, which is parallel to the X direction, in the Z direction and is disposed on the −Z side of the cross dichroic prism 3. The image light LG emitted from the second light source module 1G is incident on the side surface 3g of the cross dichroic prism 3 through the −Z side in a direction parallel to the Z direction.

The projection optical system 4 is disposed to face a side surface 3m on the +Z side of the cross dichroic prism 3, which is parallel to the X direction, in the Z direction and is disposed on the +Z side of the cross dichroic prism 3. The screen SCR is disposed to face the side surface 3m of the cross dichroic prism 3 in the Z direction and is disposed at a predetermined position on the +Z side of the projection optical system 4. Combined light LL obtained by the cross dichroic prism 3 is emitted to the +Z side in the Z direction and projected onto the screen SCR by the projection optical system 4. An enlarged image is displayed on the screen SCR.

The first to third light source modules 1R, 1G, and 1B have the same configuration although the colors of light emitted by the first to third light source modules 1R, 1G, and 1B, that is, the wavelength bands of the image light LR, LG, and LR, are different. In the following, of the first to third light source modules 1R, 1G, and 1B, the third light source module 1B will be taken as an example and a configuration of the third light source module 1B will be described in detail.

Light Source Module

Figure 2:
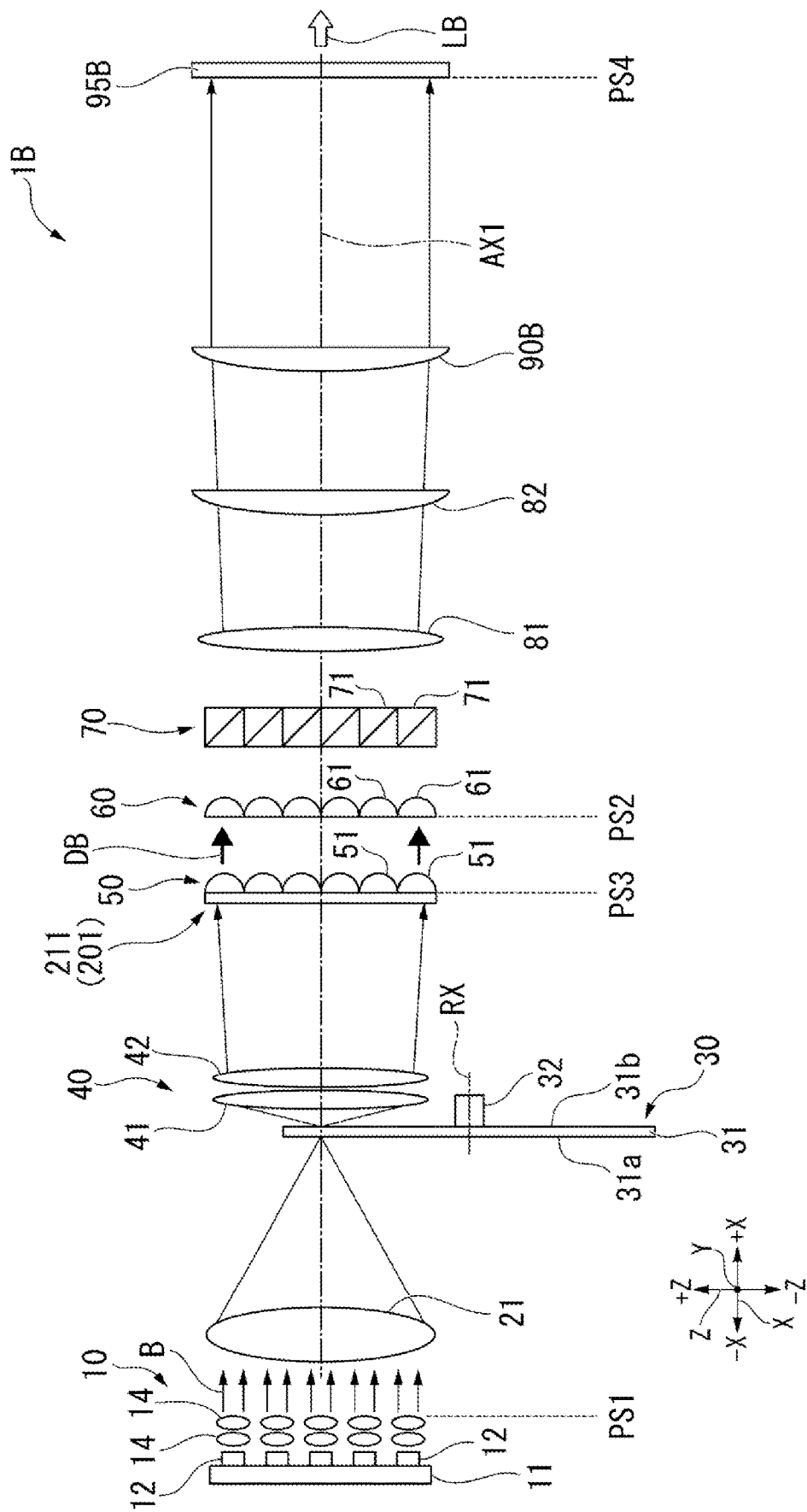
FIG. 2 is a schematic configuration diagram of a light source module of the first embodiment.

FIG. 2 is a schematic configuration diagram of the third light source module 1B of the first embodiment. As shown in FIG. 2, the third light source module 1B includes a light source unit 10, a focusing lens 21, a diffusion element 30, a pickup optical system 40, a despeckle element 201, a first lens array 50, a second lens array 60, a polarization conversion element 70, superimposing lenses 81 and 82, a field lens 90B, and a light modulation element 95B. These constituent elements are arranged in the third light source module 1B in the order listed from the −X side to the +X side in the X direction. Although the light source module includes the light source unit 10, the focusing lens 21, the diffusion element 30, the pickup optical system 40, the despeckle element 201, the first lens array 50, the second lens array 60, the polarization conversion element 70, the superimposing lenses 81 and 82, the field lens 90B, and the light modulation element 95B in the present embodiment, the present disclosure is not limited to this and the projector 100 may include the light source unit 10, the focusing lens 21, the diffusion element 30, the pickup optical system 40, the despeckle element 201, the first lens array 50, the second lens array 60, the polarization conversion element 70, the superimposing lenses 81 and 82, the field lens 90B, and the light modulation element 95B.

The light source unit 10 includes a substrate (a base material) 11, a plurality of LD light sources (light sources) 12, and a plurality of microlenses 14. The substrate 11 has plate surfaces extending parallel to a YZ plane including the Y and Z directions and has a predetermined thickness in the X direction. The plurality of LD light sources 12 are arranged on a +X side plate surface of the substrate 11 at intervals from each other. The LD light sources 12 emit blue laser light (light) B having a blue wavelength band. The blue wavelength band is a wavelength band required for the blue image light LB in the visible wavelength band, for example, a wavelength band within a range of 400 nm to 470 nm. The number of LD light sources 12 is not limited to a specific number and can be appropriately determined according to the amount of light required for the image light LB and the amount of blue laser light B emitted from one LD light source.

Two microlenses 14 are arranged on the +X side of each LD light source 12. The two microlenses 14 collimate blue laser light B emitted from the LD light source 12 to the +X side in the X direction to emit the blue laser light B further toward the +X side in the X direction. The number of microlenses 14 arranged to correspond to each LD light source 12 may be one, or three or more, and may be set as appropriate.

The light source unit 10 emits blue laser light B including a plurality of light beams that the plurality of LD light sources 12 and the plurality of microlenses 14 have collimated to the +X side in the X direction.

The focusing lens 21 is disposed on the +X side of the plurality of microlenses 14 arranged on the +X side of the light source unit 10 at a predetermined interval in the X direction from the plurality of microlenses 14. The focusing lens 21 collectively emits blue laser light B including a plurality of light beams emitted from the light source unit 10 to the +X side to focus the blue laser light B at a predetermined position on the diffusion element 30. The focusing lens 21 is made of, for example, a biconvex lens.

The diffusion element 30 is disposed on the +X side of the focusing lens 21 at a predetermined interval in the X direction from the focusing lens 21. The diffusion element 30 includes a diffusion plate 31 and a motor 32. The diffusion plate 31 is formed in a disc shape and has plate surfaces extending parallel to the YZ plane. At least one of the plate surfaces of the diffusion plate 31 is formed with a microstructure capable of diffusing the blue laser light B that is incident in focus. The motor 32 rotates the diffusion plate 31 in the YZ plane about a rotation axis RX. The rotation axis RX is located on the −Z side of an optical axis AX1 of the blue laser light B.

The blue laser light B emitted from the focusing lens 21 is focused on a plate surface portion of the diffusion plate 31 rotating about the rotation axis RX, the plate surface portion being on the +Z side of the rotation axis RX, and is then diffused by the microstructure of the diffusion plate 31. The diffused blue laser light B is emitted to the +X side of the diffusion plate 31 in the X direction.

The pickup optical system 40 is disposed on the +X side of the diffusion plate 31 of the diffusion element 30 at a predetermined interval in the X direction from the diffusion plate 31. The pickup optical system 40 includes, for example, a first lens 41 and a second lens 42. The first lens 41 and the second lens 42 are sequentially arranged side by side in the X direction. The second lens 42 is disposed on the +X side of the first lens 41. Each of the first lens 41 and the second lens 42 is made of, for example, a biconvex lens. The number of lenses included in the pickup optical system 40 is not limited to a specific number and can be appropriately determined taking into account a beam diameter required for the image light LB. The pickup optical system 40 expands the beam diameter of the blue laser light B diffused by the diffusion element 30 and emits it to the +X side in the X direction.

The despeckle element 201 is disposed on the +X side of the second lens 42 of the pickup optical system 40 at a predetermined interval in the X direction from the pickup optical system 40. The first lens array 50 is adjacent to the despeckle element 201 on the +X side thereof. The despeckle element 201 is made of a metasurface element 211. The metasurface element 211 will be described later.

The first lens array 50 includes a plurality of microlenses 51 for splitting the blue laser light DB emitted from the despeckle element 201 into a plurality of partial beams in the YZ plane. The plurality of microlenses 51 are arranged in the Y and Z directions in the YZ plane. The first lens array 50 emits the blue laser light DB split into a plurality of partial light beams to the +X side in the X direction.

The second lens array 60 includes a plurality of microlenses 61 arranged to correspond to the plurality of microlenses 51 of the first lens array 50. The second lens array 60, together with the superimposing lenses 81 and 82, forms images of the microlenses 61 of the second lens array 60 in the vicinity of an image forming region of the light modulation element 95B. The plurality of microlenses 61 are arranged in a matrix in the YZ plane perpendicular to the optical axis AX1. The second lens array 60 emits the blue laser light DB split into a plurality of partial light beams to the +X side in the X direction.

The polarization conversion element 70 converts each partial light beam split by the first lens array 50 into predetermined linearly polarized light according to the characteristics of the light modulation element 95B. The polarization conversion element 70 includes a polarization separation layer, a reflective layer, and a retardation plate. The polarization separation layer of the polarization conversion element 70 transmits one linearly polarized component among polarized components included in the blue laser light DB incident from the second lens array 60 and reflects another linearly polarized component in a direction parallel to the YZ plane perpendicular to the optical axis AX1. The reflective layer of the polarization conversion element 70 reflects the other linearly polarized light component reflected by the polarization separation layer in the X direction parallel to the optical axis AX1. The retardation plate of the polarization conversion element 70 converts the other linearly polarized component reflected by the reflective layer into the one linearly polarized component and emits the converted linearly polarized component to the +X side in the X direction.

The superimposing lens 81 is disposed on the +X side of the polarization conversion element 70 at a predetermined interval in the X direction from the polarization conversion element 70. The superimposing lens 82 is disposed on the +X side of the superimposing lens 81 at a predetermined interval in the X direction from the superimposing lens 81. The superimposing lenses 81 and 82 focus the partial light beams of the one linearly polarized component emitted from the polarization conversion element 70 such that they are superimposed in the vicinity of the image forming region of the light modulation element 95B. The first lens array 50, the second lens array 60, and the superimposing lenses 81 and 82 constitute an integrator optical system that uniformizes an in-plane light intensity distribution of the blue laser light B or the light LL in the image forming region of the projector 100.

The field lens 90B is disposed on the +X side of the superimposing lens 82 at a predetermined interval in the X direction from the superimposing lens 82. The field lens 90B aligns the traveling directions of outer peripheral portions in the YZ plane of the blue laser light DB emitted from the superimposing lens 82 and emits the aligned blue laser light DB to the +X side in the X direction. The field lens 90B limits attenuation and definition reduction of the incident blue laser light DB.

The light modulation element 95B is disposed on the +X side of the field lens 90B at a predetermined interval in the X direction from the field lens 90B. The light modulation element 95B is made of, for example, a liquid crystal light valve. The liquid crystal light valve includes a liquid crystal layer and an energy transfer layer. For example, a nematic liquid crystal or a smectic liquid crystal is used for the liquid crystal layer. The energy transfer layer is made of a photoconductor or a light absorbing film. The type of the energy transfer layer is selected according to a method of writing using the blue laser light DB. The light modulation element 95B modulates the blue laser light DB incident from the field lens 90B according to image information to form blue image light LB and emits the image light LB to the +X side in the X direction.

The image light LB emitted from the light modulation element 95B is incident on the cross dichroic prism 3 through the side surface 3b in the projector 100 shown in FIG. 1.

A position where the screen SCR on which an image is formed when the light LL is projected is arranged and a position PS4 of the image forming region of the light modulation element 95B are conjugate to each other in the optical path of the blue image light LB of the projector 100 as shown in FIGS. 1 and 2. Also, the position PS4 of the image forming region of the light modulation element 95B and a position PS3 where the first lens array 50 and the despeckle element 201 are arranged are conjugate to each other in the third light source module 1B as shown in FIG. 2. Thus, the blue laser light B is despeckled at the position PS3, such that the despeckling effect occurs strongly in the blue laser light DB incident on the light modulation element 95B at the position PS4. Because the image light LB is formed from the blue laser light DB already despeckled at the position PS4, measures for despeckling are effectively taken for the light LL projected onto the screen SCR that has been described with reference to FIG. 1.

The first light source module 1R shown in FIG. 1 includes LD light sources (not shown) that emit red laser light instead of the LD light sources 12 that emit the blue laser light B in the third light source module 1B. The first light source module 1R includes constituent elements similar to those of the third light source module 1B other than the LD light sources 12. In the first light source module 1R, red laser light is emitted from the LD light sources to the −X side in the X direction. In the first light source module 1R, a light source unit having LD light sources that emit red laser light, a focusing lens for red laser light, a diffusion element, a pickup optical system, a despeckle element, a first lens array, a second lens array, a polarization conversion element, superimposing lenses, a field lens, and a light modulation element are sequentially arranged from the +X side to the −X side in the X direction while the relative positional relationships between constituent elements corresponding to those in the third light source module 1B are maintained.

The second light source module 1G shown in FIG. 1 includes LD light sources (not shown) that emit green laser light instead of the LD light sources 12 that emit the blue laser light B in the third light source module 1B. The second light source module 1G includes constituent elements similar to those of the third light source module 1B other than the LD light sources 12. In the second light source module 1G, green laser light is emitted from the LD light sources to the +Z side in the Z direction. In the second light source module 1G, a light source unit having an LD light sources that emit green laser light, a focusing lens for green laser light, a diffusion element, a pickup optical system, a despeckle element, a first lens array, a second lens array, a polarization conversion element, superimposing lenses, a field lens, and a light modulation element are sequentially arranged from the −Z side to the +Z side in the Z direction while the relative positional relationships between constituent elements corresponding to those in the third light source module 1B are maintained.

Despeckle Element

Figure 3A:
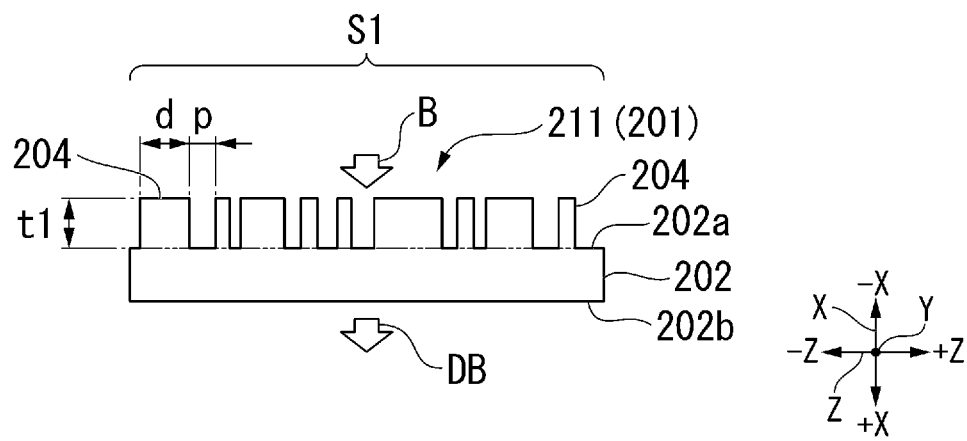
FIG. 3A is a side view of a metasurface element of the light source module shown in FIG. 2.
Figure 3B:
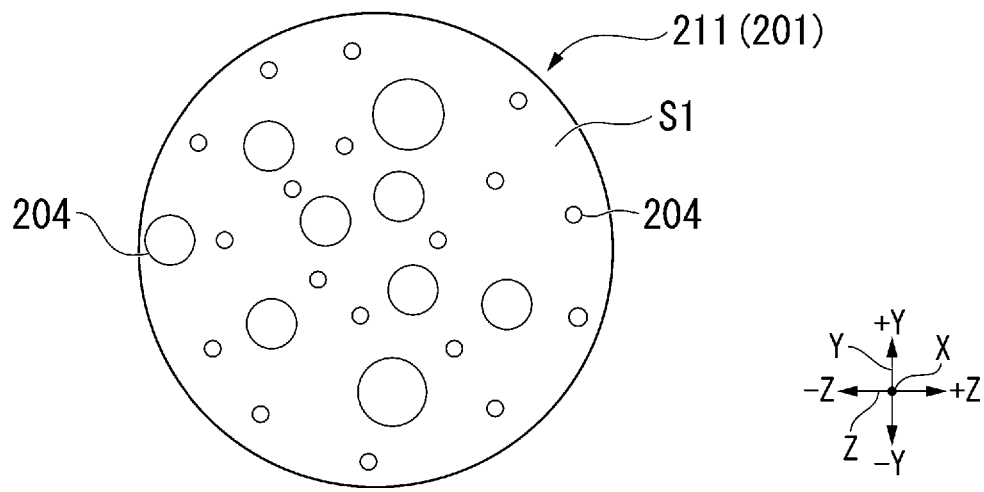
FIG. 3B is a plan view of the metasurface element shown in FIG. 3A.

FIG. 3A is a side view of the metasurface element 211 of the first embodiment viewed from the Y direction. FIG. 3B is a plan view of the metasurface element 211 viewed from the X direction. As shown in FIGS. 3A and 3B, the metasurface element 211 includes a substrate (a base material) 202 and a plurality of microstructures 204.

The substrate 202 may have a disc shape or the like in accordance with the beam shape of the blue laser light B incident from the pickup optical system 40. The substrate 202 has a plate surface 202a on the −X side, that is, on the side where the blue laser light B is incident, and a plate surface 202b on the +X side, that is, on the side where the blue laser light B is emitted. The size of the substrate 202 in the YZ plane is at least larger than the beam diameter of the blue laser light B at a position, which is spaced to the +X side apart from the pickup optical system 40 at a predetermined interval, and is preferably slightly larger than the beam diameter of the blue laser light B. The substrate 202 is formed of a material that transmits at least the blue laser light B and exhibits no or very low absorption of the blue laser light B. The material of the substrate 202 is, for example, the same as the material of microstructures 204 that will be described later and may be, for example, quartz or optical glass.

A microstructure 204 is provided on a plate surface (a first reference surface) 202a of the substrate 202. The microstructure 204 has a width d in a direction parallel to the plate surface 202a and a height t1 in the X direction perpendicular to the plate surface 202a (which is a direction crossing the reference surface). The metasurface element 211 includes a plurality of microstructures 204. The widths d and the heights t1 of the plurality of microstructures 204 and the intervals p between the microstructures 204 may be the same or different and may also be set randomly as will be described later.

If at least one or more microstructures 204 are arranged on the metasurface element 211, a resonance phenomenon of the blue laser light B can occur in the microstructures 204. Therefore, the total number of microstructures 204 provided on the metasurface element 211 can be appropriately determined according to the widths d and the heights t1 of the microstructures 204 and the intervals p between the microstructures 204 taking into account the amount of despeckling and the amount of phase modulation $\phi_B$ required for the blue laser light B. In each of FIG. 3A and subsequent drawings showing schematic configurations of the metasurface element, only a part of a plurality of microstructures arranged on the substrate 202 is illustrated in an appropriately enlarged state.

For each position within the region of the metasurface element 211 in the YZ plane, the metasurface element 211 randomly modulates the phase of the blue laser light B emitted from the LD light sources 12 and expanded by the pickup optical system 40 as shown in FIG. 2. The region of the metasurface element 211 in the YZ plane indicates a region S1 shown in FIGS. 3A and 3B. Thus, the despeckle element 201 made of the metasurface element 211 randomly modulates the phase of the incident blue laser light B and emits the phase-modulated blue laser light DB to the first lens array 50. That is, the metasurface element 211 functions as a random phase modulation element.

The widths d and the heights t1 of the microstructures 204 of the metasurface element 211 shown in FIGS. 3A and 3B and the intervals p between the microstructures 204 are set, for example, based on a relationship between the width d of a microstructure 204 and the amount of phase modulation $\phi_B$ when the height t1 of the microstructure 204 has been set to a predetermined value according to a peak wavelength of the blue laser light B. The height t1 of the microstructures 204 is a parameter that determines the range of the amount of phase modulation $\phi_B$ of the blue laser light B. In the metasurface element 211, the range of the amount of phase modulation $\phi_B$ of the blue laser light B in the region S1 where the plurality of microstructures 204 are arranged is set to 0 to $2\pi$. That is, in the metasurface element 211, the heights t1 of the plurality of microstructures 204 are set equal to a predetermined value determined based on the peak wavelength of the blue laser light B, the predetermined value being a value at which the amount of phase modulation $\phi_B$ can be $2\pi$ at maximum. The predetermined value of the height t1 is about several hundred nm, for example, 500 nm or less, preferably 200 nm or less. The predetermined value of the height t1 does not excessively exceed dimensions that equipment used for manufacturing the metasurface element 211 can manufacture and process with high precision and low yield for the material of the microstructures 204 and is preferably set taking into account such dimensions.

The amount of phase modulation φB of the blue laser light B transmitted through the plurality of microstructures 204 when the width d is changed under the condition that the height t1 of the plurality of microstructures 204 is the predetermined value described above is calculated through numerical computation. Specifically, when the width d increases from 0, the amount of phase modulation $\phi_B$ increases nonlinearly and continuously from 0 to near $2\pi$. When the width d further increases after the amount of phase modulation $\phi_B$ reaches near $2\pi$, the amount of phase modulation $\phi_B$ suddenly decreases discontinuously to near 0 and then increases nonlinearly and continuously from near 0 to near $2\pi$ again and then a sudden discontinuous decrease and a continuous increase repeat.

In the metasurface element 211, the width d of each microstructure 204 is set such that at least the amounts of phase modulation $\phi_B$ of adjacent microstructures 204 differ and the difference between the amounts of phase modulation $\phi_B$ of adjacent microstructures 204 varies randomly over the region S1.

The interval p between each microstructure 204 is appropriately set, for example, such that when three microstructures 204, that is, two microstructures 204 that are closely adjacent in the region S1 together with another microstructure 204 which is closest to one of the two microstructures 204 and differs from the other of the two microstructures 204, are chosen, the intervals between the centers or the centers of gravity of the three microstructures 204 in the YZ plane differ from each other. This setting ensures that the blue laser light B incident on the region S1 of the metasurface element 211 is subjected to highly random phase modulation.

Adjusting the widths d of the plurality of microstructures 204 and the intervals p between the microstructures 204 adjusts the randomness and the degree of randomness of phase modulation achieved by the plurality of microstructures 204 freely with high precision.

The blue laser light B incident on the metasurface element 211 from the −X side is confined in each microstructure 204 for which the width d and the height t1 have been set as described above and resonates due to the light confinement. In the region S1, a random amount of phase modulation $\phi_B$ occurs in the blue laser light DB emitted from the plurality of microstructures 204.

It is preferable that the material of the microstructures 204 have a high refractive index and a low absorption with respect to at least the blue laser light B. The material of the microstructures 204 having a high refractive index with respect to the blue laser light B can increase the amount of phase modulation $\phi_B$ that can be achieved for a given height t1, increasing the freedom of design of the microstructures 204. It is preferable that the material of the microstructures 204 be titanium oxide ($TiO_2$), silicon nitride (SiN), or the like which has a high refractive index and absorbs less light in the visible wavelength band, compared to, for example, quartz or optical glass.

Electromagnetic wave analysis such as a finite difference time domain (FDTD) method is used to analyze behaviors when the blue laser light B is incident on the metasurface element 211 for which the widths d and the heights t1 of the microstructures 204 and the intervals p between the microstructures 204 have been set as described above because the dimensions of the microstructures 204 are equal to or less than the peak wavelength of the blue laser light B. In other words, electromagnetic wave analysis such as the FDTD method is used for design evaluation of the metasurface element 211.

The metasurface element 211 is manufactured by a method such as reactive ion etching (RIE), focused ion beam (FIB), or nanoimprint lithography.

It is preferable that a +X-side end surface of the despeckle element 201 made of the metasurface element 211, that is, the plate surface 202b of the substrate 202 of the metasurface element 211, be in contact with a −X-side surface of the first lens array 50 shown in FIG. 2. The plate surface 202b of the substrate 202 may also be arranged at a slight interval in the X direction from the −X-side surface of the first lens array 50. The slight interval indicates such a short interval that both the +X-side end surface of the despeckle element 201 and the −X-side surface of the first lens array 50 are considered to be arranged at the position PS3 that will be described later in the X direction.

The third light source module 1B of the first embodiment described above includes the LD light sources 12, the metasurface element 211, and the light modulation element 95B. The LD light sources 12 emit blue laser light B. The metasurface element 211 constitutes the despeckle element 201 that takes measures for despeckling the blue laser light B and modulates the phase of the blue laser light B emitted from the LD light sources 12. The light modulation element 95B modulates the phase-modulated blue laser light DB emitted from the metasurface element 211 to generate image light LB.

In the third light source module 1B of the first embodiment, the despeckle element 201 can be made ultrathin and small compared to a known element for taking measures for despeckling such as a diffusion plate because the despeckle element 201 is made of the metasurface element 211.

In the third light source module 1B of the first embodiment, the metasurface element 211 is disposed at the position PS3 that is conjugate to the image forming region of the light modulation element 95B. The position PS4 in the X direction of the image forming region of the light modulation element 95B is a position that is conjugate to the screen SCR in the optical paths of the blue image light LB and the light LL obtained by combining the three-color image light LR, LG, and LB.

According to the third light source module 1B of the first embodiment, the despeckle element 201 made of the metasurface element 211 is disposed at the position PS3 and the blue laser light B is despeckled at the position PS3 and thus the effect of despeckling the blue laser light DB in the image forming region of the light modulation element 95B can be maximized compared to the case where it is disposed at a position that is not conjugate to the position PS3 in the X direction.

In the third light source module 1B of the first embodiment, the metasurface element 211 includes the substrate 202 and at least one microstructure 204. The substrate 202 has a plate surface 202a on the −X side as a reference for installing the metasurface element 211 in the X direction. The microstructure 204 is disposed on the plate surface 202a of the substrate 202. The microstructure 204 has a width (a predetermined width) d in the Z direction parallel to the plate surface 202a and a height (a predetermined height) t1 in the X direction perpendicular to the plate surface 202a. The heights t1 of the plurality of microstructures 204 are set to a predetermined height t1 according to the peak wavelength of the blue laser light B. The widths d of the plurality of microstructures 204 are set according to the amount of phase modulation $\phi_B$ required for the blue laser light DB emitted from the microstructures 204 after it is incident on the microstructures 204 and then resonated due to the light confinement effect. The "laser light passing through the microstructure" described in the present specification and claims indicates the blue laser light DB emitted from the microstructures 204 after it is incident on the microstructures 204 and then resonated due to the light confinement effect as described above.

According to the third light source module 1B of the first embodiment, the metasurface element 211 and the despeckle element 201 can be made ultrathin and small because the widths d or the heights t1 of the microstructures 204 are set to dimensions of about the same order as the peak wavelength or the wavelength band of the blue laser light B.

In the third light source module 1B of the first embodiment, at least one of the height t1 and the width d of a microstructure 204 of the metasurface element 211 is set according to the amount of phase modulation $\phi_B$ for the blue laser light B that has passed through the microstructure 204.

The blue laser light B incident on the metasurface element 211 is confined in the microstructure 204, which causes a resonance called a Fabry-Perot resonance in the X direction. According to the third light source module 1B of the first embodiment, the width d or the height t1 of the microstructure 204 is adjusted to change the resonance condition of the blue laser light B, such that the amount of phase modulation $\phi_B$ of the blue laser light B can be adjusted freely with high precision. In addition, when the metasurface element 211 includes a plurality of microstructures 204 in the region S1, partial or local ones of the microstructures 204 in the region S1 can exhibit a different amount of phase modulation $\phi_B$ from that of the surrounding ones by adjusting the widths d or the heights t1 of the partial or local microstructures 204 and the intervals p between the partial or local microstructures 204.

In the metasurface element 211, at least one of the height t1 and the width d of a microstructure 204 is set according to the amount of phase modulation $\phi_B$ for the blue laser light B that has passed through the microstructure 204. That is, in a modification of the first embodiment described above, the heights t1 of a plurality of microstructures 204 may be set according to the amount of phase modulation $\phi_B$ required for the blue laser light DB that has passed through the microstructures 204. The widths d of the plurality of microstructures 204 may be set to a predetermined width according to the peak wavelength of the blue laser light B. Further, both the heights t1 and the widths d of the plurality of microstructures 204 may be set for each microstructure 204 according to the peak wavelength of the blue laser light B and the amount of phase modulation $\phi_B$ required for the blue laser light DB that has passed through the microstructure 204.

In the third light source module 1B of the first embodiment, the metasurface element 211 includes a plurality of microstructures 204. Even when one microstructure 204 is provided on the substrate 202, the light confinement effect and Fabry-Perot resonance of the blue laser light B occur as described above. However, when a plurality of microstructures 204 are provided on the substrate 202, the Fabry-Perot resonance in each microstructure 204 and a resonance between a plurality of microstructures 204 in a direction parallel to the YZ plane are coupled to cause an effect of multiple resonances including a waveguide mode resonance. Therefore, a metasurface element 211 that exhibits a desired phase modulation function regardless of the continuity or regularity in the YZ plane can be obtained by adjusting the width d or the height t1 of each microstructure 204 to easily and freely control the amount of phase modulation $\phi_B$ of the blue laser light B while adjusting the intervals p between the plurality of microstructures 204 or the relative arrangement of the plurality of microstructures 204 to control the conditions of the waveguide mode resonance of the blue laser light B. Even in a situation where an installation space in the projector 100 is limited, the distribution of the amount of phase modulation $\phi_B$ in the region S1 can be freely set according to, for example, the light intensity distribution of the blue laser light B in the YZ plane or the arrangement of constituent elements of the third light source module 1B and the optical path of the blue laser light B by adjusting the widths d, the heights t1, or the intervals p of partial or local ones of the plurality of microstructures 204.

In the third light source module 1B of the first embodiment, the heights t1 of microstructures 204 in the region S1 spanning the entire plate surface 202a of the substrate 202 of the metasurface element 211 are set such that the amounts of phase modulation of blue laser light B emitted from the microstructures 204 are 0 to $2\pi$.

According to the third light source module 1B of the first embodiment, it is possible to limit the heights t1 of the microstructures 204 of the metasurface element 211 by setting a minimum required amount of phase modulation $\phi_B$ in the region S1 of the metasurface element 211 taking into account that the amount of phase modulation $\phi_B$ of $2n$ or more for the blue laser light B is in phase with one of the amounts of phase modulation $\phi_B$ of 0 to $2\pi$. As the heights t1 of microstructures 204 increase, variations and errors are more likely to occur in the columnar or tapered shapes or the heights of the microstructures 204, making it difficult to manufacture the metasurface element 211 in the shape as designed. Appropriately limiting the heights t1 of the microstructures 204 as described above can increase the degree of freedom in designing the metasurface element 211 and the despeckle element 201, facilitate the manufacture of the metasurface element 211, and reduce manufacturing errors, thus achieving a further reduction in the thickness and size.

The projector 100 of the first embodiment includes the third light source module 1B described above and the projection optical system 4. The projection optical system 4 combines the image light LR, LG, and LB from the third light source modules 1B and then expands the combined light LL toward the +Z side in the Z direction and projects it onto the screen SCR arranged at a predetermined position in the Z direction.

According to the projector 100 of the first embodiment, it is possible to effectively take measures for despeckling the light LL projected onto the screen SCR while limiting the size of the third light source module 1B because the ultrathin and small despeckle element 201 made of the metasurface element 211 is arranged in the third light source module 1B. In particular, in the case where the size and weight of the projector 100 are reduced, the third light source module 1B and the first and second light source modules 1R and 1G having the same constituent elements as the third light source module 1B are each extremely limited in its space where a despeckle element can be arranged. Even in such a case, the despeckle element 201 made of the metasurface element 211 can be easily arranged at the position PS3 or other desired positions where the despeckling effect of each of the first to third light source modules 1R, 1G, and 1B can be strongly exhibited.

First Modification

Next, a first modification of the metasurface element 211 of the first embodiment will be described with reference to FIGS. 4A and 4B. Components of a metasurface element in each of the following modifications which are common with the metasurface element of the first embodiment described above are designated by the same reference numerals and the description thereof will be omitted.

Figure 4A:
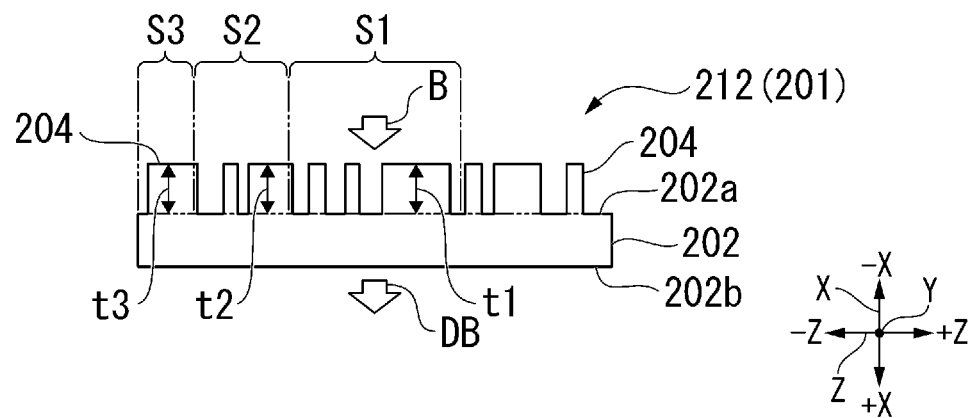
FIG. 4A is a side view of a first modification of the metasurface element shown in FIG. 3A.

FIG. 4A is a side view of a metasurface element 212 which is the first modification of the metasurface element 211 of the first embodiment, viewed from the Y direction. FIG. 4B is a plan view of the metasurface element 212 viewed from the X direction.

Figure 4B:
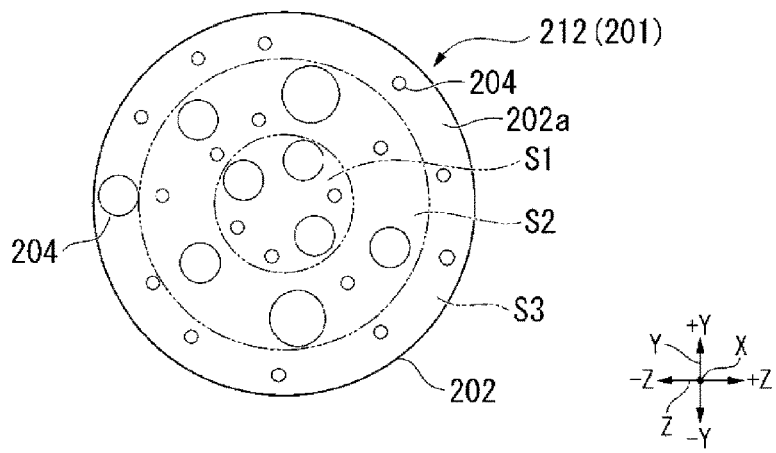
FIG. 4B is a plan view of the metasurface element shown in FIG. 4A.

As shown in FIGS. 4A and 4B, the metasurface element 212 includes a substrate (a base material) 202 and a plurality of microstructures 204 as described in the first embodiment. However, the metasurface element 212 is divided into a plurality of regions that are arranged in the radial direction from the center of the plate surface 202a, that is, the center of the substrate 202 viewed from the X direction. The metasurface element 212 shown in FIGS. 4A and 4B is divided into three regions S1, S2, and S3 that are arranged in the radial direction from the center of the plate surface 202a. A plurality of microstructures 204 are formed in each of the plurality of regions S1, S2, and S3.

The range of the amount of phase modulation $\phi_B$ of blue laser light B that has passed through the region S1 including the center of the plate surface 202a is set to 0 to $2\pi$. That is, the heights t1 of the plurality of microstructures 204 arranged in the region S1 are set equal to a predetermined value determined based on the peak wavelength of the blue laser light B, the predetermined value being a value at which the amount of phase modulation $\phi_B$ can be $2\pi$ at maximum.

The region S2 is radially adjacent to the region S1 and radially outside the region S1. The range of the amount of phase modulation $\phi_B$ of the blue laser light B that has passed through the region S2 is set to 0 to $\pi$. In the metasurface element 212, the heights t2 of the plurality of microstructures 204 arranged in the region S2 are set equal to the height t1. The widths d of the plurality of microstructures 204 arranged in the region S2 are appropriately adjusted such that the amount of phase modulation $\phi_B$ of the blue laser light B that has passed through the region S2 is n at maximum.

The region S3 is radially adjacent to the region S2 and radially outside the region S2. The range of the amount of phase modulation $\phi_B$ of the blue laser light B that has passed through the region S3 is set to 0 to $\pi/2$. In the metasurface element 212, the heights t3 of the plurality of microstructures 204 arranged in the region S3 are set equal to the height t1. The widths d of the plurality of microstructures 204 arranged in the region S3 are appropriately adjusted such that the amount of phase modulation $\phi_B$ of the blue laser light B that has passed through the region S2 is $\pi/2$ at maximum.

As described above, the metasurface element 212 of the first modification of the first embodiment includes the substrate 202 and at least one microstructure 204. In the metasurface element 212 of the first modification, at least one of the heights t1 to t3 and the width d of the plurality of microstructures 204 is set according to the amount of phase modulation $\phi_B$ for the blue laser light B that has passed through the microstructures 204. Similar to the metasurface element 211, the metasurface element 212 of the first modification is made of the substrate 202 and the microstructures 204 that have about the same dimensions as those of the wavelength band of the blue laser light B and thus can realize an ultrathin and small despeckle element 201. Further, according to the metasurface element 212 of the first modification, the amount of phase modulation $\phi_B$ of the blue laser light B can be adjusted freely with high precision by adjusting the widths d or the heights t1 of the microstructures 204.

The metasurface element 212 of the first modification of the first embodiment is divided into a plurality of regions S1, S2, and S3 that are arranged in the radial direction of the plate surface 202a of the substrate 202. A maximum amount of phase modulation of the blue laser light B that has passed through microstructures 204 arranged on the plate surface 202a in the radially outer region (a first region) S2 among the two radially adjacent regions S1 and S2 of the plate surface 202a is $\pi$, which is smaller than a maximum amount of phase modulation $2\pi$ of the blue laser light B that has passed through microstructures 204 arranged on the plate surface 202a in the region (a second region which is the radially inner one of the two regions) S1. A maximum amount of phase modulation of the blue laser light B that has passed through microstructures 204 arranged on the plate surface 202a in the radially outer region (a first region) S3 among the two radially adjacent regions S2 and S3 of the plate surface 202a is $\pi/2$, which is smaller than a maximum amount of phase modulation n of the blue laser light B that has passed through microstructures 204 arranged on the plate surface 202a in the region (a second region which is the radially inner one of the two regions) S2. That is, the amount of phase modulation of the blue laser light B that has passed through the region S1 closest to the center of the plate surface 202a is 0 to 2π. The amount of phase modulation of the blue laser light B that has passed through the region S2 outside the region S1 is 0 to π. The amount of phase modulation of the blue laser light B that has passed through the region S3 outside the region S2 is 0 to π/2.

In the metasurface element 212 of the first modification, the maximum amount of phase modulation of the blue laser light B that has passed through a region of the plate surface 202a of the substrate 202 becomes smaller as the region more radially outward and thus the angle of diffusion in the YZ plane of the blue laser light DB emitted to the +X side from microstructures 204 in the region decreases. According to the metasurface element 212 of the first modification, the angle of diffusion of the blue laser light DB emitted to the +X side by the plurality of microstructures 204 in a radially outer region of the plate surface 202a can be limited compared to in a radially inner region of the plate surface 202a. This reduces blue laser light DB that leaks outside the metasurface element 212 in the YZ plane, that is, outside a processing target region of the third light source module 1B, and thus can increase the utilization efficiency of the blue laser light DB.

In the metasurface element 212 of the first modification, the widths d of a plurality of microstructures 204 formed in the regions S1, S2, and S3 are adjusted in order to make the maximum amount of phase modulation for the blue laser light B different between the regions S1, S2, and S3, but at least one of the heights t1 to t3 and the width d may also be adjusted. That is, the heights t1, t2, and t3 of a plurality of microstructures 204 formed in the regions S1, S2, and S3 of the metasurface element 212 may also be adjusted to successively decrease the maximum amounts of phase modulation for the blue laser light B that has passed through the regions S1, S2, and S3. Both the heights t1, t2, t3 and the widths d of a plurality of microstructures 204 formed in the regions S1, S2, and S3 of the metasurface element 212 may also be adjusted to successively decrease the maximum amounts of phase modulation for the blue laser light B that has passed through the regions S1, S2, and S3. Whether either or both of the heights t1, t2, and t3 or the widths d of microstructures 204 in the regions into which the metasurface element 212 is divided in plan view are adjusted is appropriately determined taking into account a minimum dimension that can be realized with high accuracy and high yield by a manufacturing method and device for the metasurface element 212.

The metasurface element 212 of the first modification is divided into three regions S1 to S3 that are arranged in the radial direction of the plate surface 202a of the substrate 202, but the number of divided regions is not limited to three. That is, for the metasurface element 212 of the first modification, it is only necessary that a maximum amount of phase modulation applied to the blue laser light B that has passed through a radially outer region is smaller than a maximum amount of phase modulation applied to the blue laser light B that has passed through an adjacent inner region, while the number of divided regions may be two, or four or more.

In a further modification of the metasurface element 212 of the first modification, the maximum amount of phase modulation of blue laser light DB emitted from the microstructure 204 may decrease toward an outer edge from the radial center or a predetermined radial position of the plate surface 202a of the substrate 202. This configuration also reduces blue laser light DB that leaks outside a processing target region of the third light source module 1B and thus can increase the utilization efficiency of the blue laser light DB.

In the metasurface element 212 of the first modification, the respective maximum amounts of phase modulation applied to the blue laser light B that has passed through the three regions S1 to S3 are 2π, π, and π/2 and may also be, for example, 2π, 4π/3, and 2π/3 or π, π/2, and π/4. That is, for the metasurface element 212 of the first modification, it is only necessary to maintain the magnitude relationship that a maximum amount of phase modulation applied to the blue laser light B that has passed through a radially outer region is smaller than a maximum amount of phase modulation applied to the blue laser light B that has passed through an adjacent inner region as described above, while the maximum amount of phase modulation in each region may be appropriately adjusted.

In the metasurface element 212 of the first modification, a ratio of the radial dimensions of the plurality of divided regions arranged in the radial direction of the plate surface 202a of the substrate 202 is appropriately adjusted taking into account an amount by which the angle of diffusion of blue laser light DB emitted from microstructures 204 in each region is to be reduced, the size of the substrate 202 in the YZ plane, that is, the diameter of the substrate 202, and the like. To increase the utilization efficiency of the blue laser light DB while increasing the despeckle performance of the metasurface element 212, it is preferable that a maximum amount of phase modulation applied to blue laser light B emitted from a radially inner region be as large as possible and it is preferable that a region to which a relatively larger maximum amount of phase modulation is applied than that applied to a radially outer region be larger than the radially outer region. In an example, the range of the region S1 of the metasurface element 212 of the first modification described above is set from the center of the plate surface 202a to 50% or more and 70% or less of the diameter and the range of the region S2 is set from an outer edge of the region S1 to 80% or more and 90% or less of the diameter of the plate surface 202a.

Second Modification

Next, a second modification of the metasurface element 211 of the first embodiment will be described with reference to FIG. 5.

Figure 5:
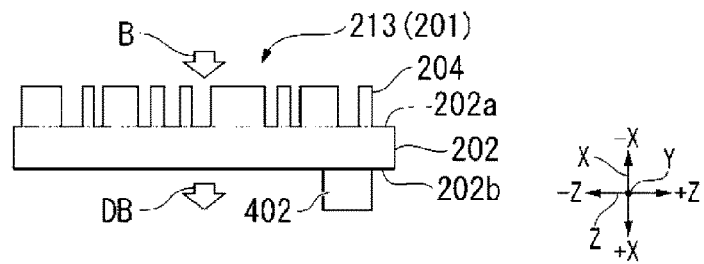
FIG. 5 is a side view of a second modification of the metasurface element shown in FIG. 3A.

FIG. 5 is a side view of a metasurface element 213 which is the second modification of the metasurface element 211 of the first embodiment, viewed from the Y direction. As shown in FIG. 5, the metasurface element 213 includes a substrate (a base material) 202 and a plurality of microstructures 204 as described in the first embodiment. However, the metasurface element 213 is provided with a vibrator 402 at a radially outer position of the plate surface 202b. As the vibrator 402 operates, the metasurface element 213 vibrates linearly in a direction parallel to the YZ plane and hardly vibrates in the X direction.

The vibrator 402 is made of, for example, a micromotor, a micro-electro-mechanical systems (MEMS) device, a piezo element, or the like. The type of the vibrator 402 is not particularly limited as long as it can vibrate the metasurface element 213 in a direction parallel to the YZ plane as described above.

As described above, the metasurface element 213 of the second modification of the first embodiment includes the substrate 202 and at least one microstructure 204. In the metasurface element 213 of the second modification, at least one of the height t1 and the width d of the plurality of microstructures 204 is set according to the amount of phase modulation $\phi_B$ for the blue laser light B that has passed through the microstructures 204. Similar to the metasurface element 211, the metasurface element 213 of the second modification is made of the substrate 202 and the microstructures 204 that have about the same dimensions as those of the wavelength band of the blue laser light B and thus can realize an ultrathin and small despeckle element 201. Further, according to the metasurface element 213 of the second modification, the amount of phase modulation $\phi_B$ of the blue laser light B can be adjusted freely with high precision by adjusting the widths d or the heights t1 of the microstructures 204.

The metasurface element 213 of the second modification of the first embodiment further includes the vibrator 402 that vibrates the substrate 202 and the plurality of microstructures 204 that are formed integrally with each other in a direction parallel to the plate surface (first reference surface) 202a, that is, a direction parallel to the YZ plane. In the metasurface element 213 of the second modification of the first embodiment, as the vibrator 402 operates, the positions of the microstructures 204 in the YZ plane change and therefore a phase modulation pattern for the incident blue laser light B changes with time. Thus, a spatial distribution of phase modulation formed by the microstructures 204 changes with time and speckle noise of the blue laser light DB are superimposed with time. The metasurface element 213 of the second modification uses the vibrator 402 to change the phase modulation pattern for the blue laser light B with time and thus can increase the effect of despeckling the blue laser light DB compared to the metasurface element 211 of the first embodiment.

The shape of the vibrator 402 and its arrangement on the metasurface element 213 can be changed as appropriate as long as they do not interfere with blue laser light B and DB traveling in the X direction. For example, when the vibrator 402 is formed of a material that transmits blue laser light B and DB, the vibrator 402 may be arranged near a radial center of the plate surface 202b.

In a further modification, the metasurface element 213 of the second modification may be rotatable about the center of the plate surfaces 202a and 202b in a direction parallel to the YZ plane. When the vibrator 402 made of a rotary motor or the like is formed of a material that transmits blue laser light B and DB and the substrate 202 is slightly larger than the beam diameter of the incident blue laser light B as described in the first embodiment, the vibrator 402 may be arranged at a center portion of the plate surface 202b of the substrate 202. When the vibrator 402 made of a rotary motor or the like is formed of a material that does not easily transmit the blue laser light B and DB, for example, the radius of the substrate 202 may be increased to about the beam diameter of the incident blue laser light B and the vibrator 402 may be provided at the center portion of the plate surfaces 202a and 202b and arranged on the ±Y side and the ±Z side of the optical axis AX1 of the blue laser light B and DB. The blue laser light B is incident from the −X side on a region, overlapping the optical path of the blue laser light B, of the metasurface element 213 that rotates about the vibrator 402 in parallel with the YZ plane. Similar to the metasurface element 213 of the second modification described above which vibrates linearly, such a metasurface element 213 that rotationally vibrates can be used to change the phase modulation pattern for the blue laser light B with time and thus can increase the effect of despeckling the blue laser light DB compared to the metasurface element 211 of the first embodiment. The direction and pattern of vibration can be arbitrarily selected as long as the spatial distribution of phase modulation formed by the plurality of microstructures 204 can be changed with time as described above.

Similar to the first modification, the metasurface element 213 of the second modification may be divided into a plurality of regions that are arranged in the radial direction when viewed from the X direction and the maximum amount of phase modulation for the blue laser light B that has passed through each region may become smaller as the region is more radially outward.

Third Modification

Next, a third modification of the metasurface element 211 of the first embodiment will be explained using FIG. 6.

Figure 6:
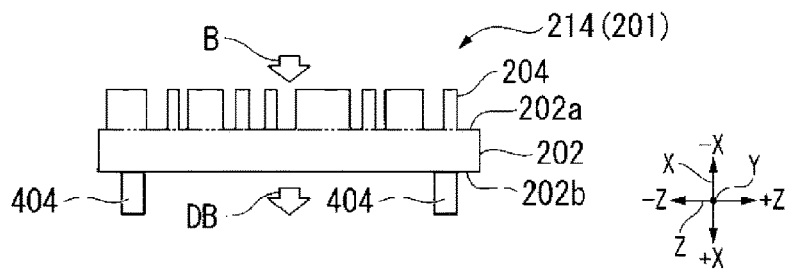
FIG. 6 is a side view of a third modification of the metasurface element shown in FIG. 3A.

FIG. 6 is a side view of a metasurface element 214 which is the third modification of the metasurface element 211 of the first embodiment, viewed from the Y direction. As shown in FIG. 6, the metasurface element 214 includes a substrate (a base material) 202 and a plurality of microstructures 204 as described in the first embodiment. However, the metasurface element 214 is provided with a heater(s) 404 at a radially outer position of the plate surface 202b.

The plurality of microstructures 204 of the metasurface element 214 are formed of a material that transmits blue laser light B and contracts or expands to change in volume with changes in temperature or a material that transmits blue laser light B and undergoes a phase change to either an amorphous state or a crystalline state with changes in temperature. Materials that contract or expand with changes in temperature include an optical resin with high thermal expansion such as polymethyl methacrylate (PMMA). Materials of the microstructures 204 that undergo a phase change with changes in temperature as described above include, for example, a phase change material (GSST) formed by adding selenium (Se) to a chalcogenide-based germanium (Ge)-antimony (Sb)-tellurium (Te) (GST) optical phase transition material. When GSST is heated, the atomic structure of GSST changes to a random mixture of atoms from amorphous and shifts to a more ordered crystalline structure than before heating, thus undergoing a phase change. The phase change of GSST changes the optical path of the blue laser light B that passes through the microstructure 204, affecting the refractive power of GSST. On the other hand, the phase change of GSST little affects the transparency of the microstructure 204 to the blue laser light B. The volume change or phase change of the microstructures 204 is reversible with respect to temperature changes.

The substrate 202 is made of a thermally conductive material that transmits blue laser light B and is capable of at least transferring heat from the heater 404 to the plurality of microstructures 204. The material of the substrate 202 may be the same material as that of the microstructures 204 which transmit blue laser light B and contract or expand with changes in temperature or undergo a phase change with changes in temperature.

In the metasurface element 214, the heater 404 operates to change the temperature of at least the plurality of microstructures 204 within a range in which the material of the microstructures 204 can contract or expand to change the sizes of the microstructures 204, that is, the widths d and the heights t1 of the microstructures 204 and the intervals p between the microstructures 204, with the temperature, thus changing the amount of phase modulation $\phi_B$ for the blue laser light B. Alternatively, the heater 404 operates to change the temperature of at least the plurality of microstructures 204 within a range in which phase can change between an amorphous state and a crystalline state to change the refractive power and the amount of phase modulation $\phi_B$ for the blue laser light B of each of the microstructures 204.

As described above, the metasurface element 214 of the third modification of the first embodiment includes the substrate 202 and at least one microstructure 204. In the metasurface element 214 of the third modification, at least one of the height t1 and the width d of the plurality of microstructures 204 is set according to the initial amount of phase modulation $\phi_B$ set for the blue laser light B that has passed through the microstructures 204. Similar to the metasurface element 211, the metasurface element 214 of the third modification is made of the substrate 202 and the microstructures 204 that have about the same dimensions as those of the wavelength band of the blue laser light B and thus can realize an ultrathin and small despeckle element 201.

In the metasurface element 214 of the third modification of the first embodiment, the microstructures 204 are formed of a material that contracts or expands with changes in temperature. In the metasurface element 214 thus configured, running or stopping the heater 404 changes the width d and the height t1 of the microstructures 204 and thus can change the phase modulation pattern for the incident blue laser light B with time.

In the metasurface element 214 of the third modification of the first embodiment, the microstructures 204 may also be formed of a material with a phase that changes to an amorphous state or a crystalline state with changes in temperature. In the metasurface element 214 thus configured, running or stopping the heater 404 causes the microstructures 204 to undergo a phase change between an amorphous state and a crystalline state, changing the refractive power of the microstructure 204, and thus can change the phase modulation pattern for the incident blue laser light B with time.

In the metasurface element 214 of the third modification of the first embodiment, a spatial distribution of phase modulation formed by the microstructures 204 changes with time and speckle noise components of the blue laser light DB are superimposed with time as described above. The metasurface element 214 of the third modification changes the amount of phase modulation $\phi_B$ of the blue laser light B that has passed through the microstructures 204 with time through temperature control using the heater 404 to change the phase modulation pattern for the blue laser light B of the plurality of microstructures 204 with time and thus can increase the randomness of the phase modulation pattern for the blue laser light B and the effect of despeckling the blue laser light DB, compared to the metasurface element 211 of the first embodiment.

Similar to the first modification, the metasurface element 214 of the third modification may be divided into a plurality of regions that are arranged in the radial direction when viewed from the X direction and the maximum amount of phase modulation for the blue laser light B that has passed through each region may become smaller as the region is more radially outward.

Similar to the second modification, the metasurface element 214 of the third modification may further include a vibrator 402 that vibrates the substrate 202 and the plurality of microstructures 204 that are integrally formed with each other in a direction parallel to the YZ plane.

In the metasurface element 211 of the first embodiment and the metasurface elements 212, 213, and 214 of the first to third modifications of the first embodiment, the microstructures 204 are formed only on the plate surface 202a of the substrate 202. However, the microstructures 204 may be provided on any one of the plate surfaces 202a and 202b of the substrate 202 and may be provided, for example, only on the plate surface 202b. In this case, the vibrator 402 described in the second modification and the heater 404 described in the third modification may be provided, for example, on the plate surface 202a.

Second Embodiment

Next, a second embodiment of the present disclosure will be described with reference to FIGS. 4A and 4B.

Components of a light source module and a metasurface element in each of the second and subsequent embodiments below which are common with the light source module and the metasurface element of the above embodiment are designated by the same reference numerals and the description thereof will be omitted. The light source modules of the second and subsequent embodiments will be described mainly with respect to features different from those of the light source module of the above embodiment.

Figure 7:
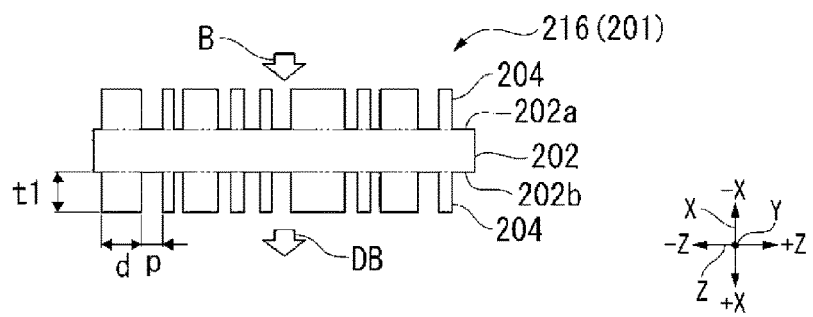
FIG. 7 is a side view of a metasurface element of a second embodiment applicable to the light source module shown in FIG. 2.

Although not shown, a third light source module 1B of the second embodiment includes a metasurface element 216 shown in FIG. 7 as a despeckle element 201 instead of the metasurface element 211 of the first embodiment in the third light source module 1B shown in FIG. 2. FIG. 7 is a side view of the metasurface element 216 of the second embodiment viewed from the Y direction.

As shown in FIG. 7, the metasurface element 216 includes a substrate 202 and a plurality of microstructures 204. In the metasurface element 211 of the first embodiment, a plurality of microstructures 204 are provided only on the plate surface 202a of the substrate 202, whereas in the metasurface element 216 of the second embodiment, a plurality of microstructures 204 are provided on the plate surfaces 202a and 202b of the substrate 202. The plate surfaces 202a and 202b are parallel to each other and parallel to the Z direction. That is, the metasurface element 216 is an element in which a plurality of microstructures 204 are also provided on the plate surface (a second reference surface) 202b on the +X side of the substrate 202 of the metasurface element 211. The metasurface element 216 has the same configuration as the metasurface element 211 except that a plurality of microstructures 204 are provided on the plate surface 202b as described above.

A microstructure 204 provided on the plate surface 202b of the substrate 202 has a width d in a direction parallel to the plate surface 202b and a height t1 in the X direction perpendicular to the plate surface 202b (which is a direction crossing the reference surface). A plurality of microstructures 204 are arranged on the plate surface 202b. The plurality of microstructures 204 provided on the plate surface 202b are arranged at desired intervals p in the Z direction.

In the metasurface element 216, the plurality of microstructures 204 provided on the plate surface 202b of the substrate 202 are aligned with the plurality of microstructures 204 provided on the plate surface 202a of the substrate 202 in the YZ plane. Here, the YZ plane indicates "a direction parallel to the first reference surface and the second reference surface" in the claims that will be described later.

As described above, the metasurface element 216 of the second embodiment includes the substrate 202 and at least one microstructure 204. In the metasurface element 216 of the second embodiment, at least one of the height t1 and the width d of the plurality of microstructures 204 is set according to the initial amount of phase modulation $\phi_B$ set for the blue laser light B that has passed through the microstructures 204. Similar to the metasurface element 211 of the first embodiment, the metasurface element 216 of the second embodiment is made of the substrate 202 and the microstructures 204 that have about the same dimensions as those of the wavelength band of the blue laser light B and thus can realize an ultrathin and small despeckle element 201.

In the metasurface element 216 of the second embodiment, the substrate (a base material) 202 has the plate surface 202b parallel to the plate surface 202a. The metasurface element 216 further includes microstructures 204 arranged on the plate surface 202b in addition to those on the plate surface 202a. The microstructures 204 arranged on the plate surface 202b each have a width d in a direction along the YZ plane and a height t1 in the X direction crossing the plate surface 202b. At least one of the height t1 and the width d of a microstructure 204 arranged on the plate surface 202b is also set according to the amount of phase modulation $\phi_B$ required for the blue laser light B that has passed through the microstructure 204.

In the metasurface element 216 of the second embodiment, the plurality of microstructures 204 arranged on the plate surface 202a of the substrate 202 and the plurality of microstructures 204 arranged on the plate surface 202b are aligned with each other along the YZ plane parallel to the plate surfaces 202a and 202b. The metasurface element 216 of the second embodiment can increase the range of the amount of phase modulation $\phi_B$ that depends on the height t1, compared to the configuration in which microstructures 204 are formed only on the plate surface 202a of the substrate 202. For example, when the height t1 of the microstructures 204 arranged on the plate surface 202a and the height t1 of the microstructures 204 arranged on the plate surface 202b are equal, the metasurface element 216 can achieve an amount of phase modulation ($2 \times \phi_B$) that is twice the amount of phase modulation $\phi_B$ achieved by the plurality of microstructures 204 of the metasurface elements 211.

The plurality of microstructures 204 of the metasurface element 216 of the second embodiment are manufactured by a method such as RIE, EIB, or nanoimprint lithography as described in the first embodiment and the manufacturing difficulty increases as the height t1 increases. That is, manufacturing a structure with a great height t1 is likely to cause dimension errors such as variations in the height t1 and the shape of the microstructure 204 becoming tapered, which should be originally rectangular when viewed from a direction parallel to the YZ plane. However, according to the metasurface element 216 of the second embodiment, the height t1 of the microstructures 204 formed on each of the plate surface 202a or the plate surface 202b of the substrate 202 can be reduced below a height corresponding to the amount of phase modulation $\phi_B$ required for the metasurface element 216, down to a minimum height corresponding to half the amount of phase modulation $\phi_B$ required for the metasurface element 216 ($\phi_B/2$). This can reduce the difficulty of manufacturing the metasurface element 216 of the second embodiment, compared to the difficulty of manufacturing the metasurface element 211 of the first embodiment. In other words, when the height t1 of the microstructures 204 formed on each of the plate surface 202a or the plate surface 202b of the substrate 202 is a dimension close to the manufacturing limit of the method such as RIE, EIB, or nanoimprint lithography, the amount of phase modulation $\phi_B$ accurately achieved by the metasurface element 216 of the second embodiment can be increased compared to the amount of phase modulation $\phi_B$ accurately achieved by the metasurface element 211 of the first embodiment.

In another aspect of the metasurface element 216 of the second embodiment, the plurality of microstructures 204 arranged on the plate surface 202a of the substrate 202 and the plurality of microstructures 204 arranged on the plate surface 202b may be displaced from each other along the YZ plane. The amount of displacement of the plurality of microstructures 204 arranged on the plate surface 202b of the substrate 202 with respect to the plurality of microstructures 204 arranged on the plate surface 202a of the substrate 202 is shorter than, for example, a maximum interval p and is preferably shorter than an average of the intervals p between the plurality of microstructures 204. The amount of displacement is appropriately adjusted to such an extent that it does not eliminate the intervals p between the microstructures 204 arranged on the plate surfaces 202a and 202b of the substrate 202 when viewed in the X direction and is preferably set to such an extent that it does not reduce the randomness of the phase modulation pattern achieved by the plurality of microstructures 204.

In the metasurface element 216 of the second embodiment and the other aspect described above, a plurality of microstructures 204 are arranged on each of the plate surfaces 202a and 202b of the substrate 202, but one or at least one microstructure 204 may be arranged on each of the plate surfaces 202a and 202b of the substrate 202.

First Modification

Figure 8A:
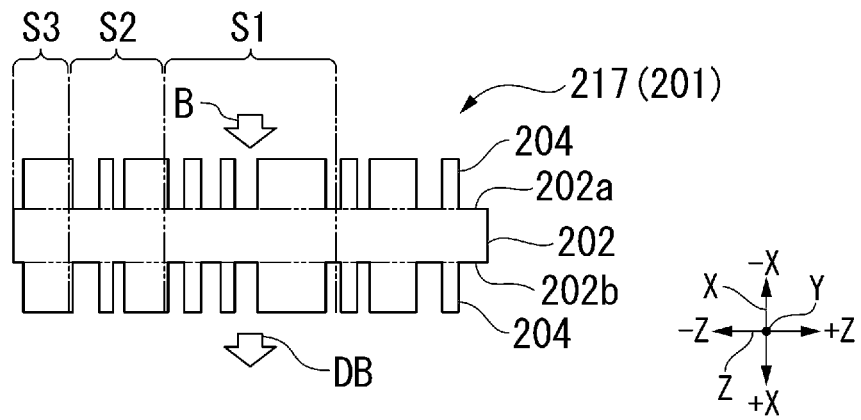
FIG. 8A is a side view of a first modification of the metasurface element shown in FIG. 7.
Figure 8B:
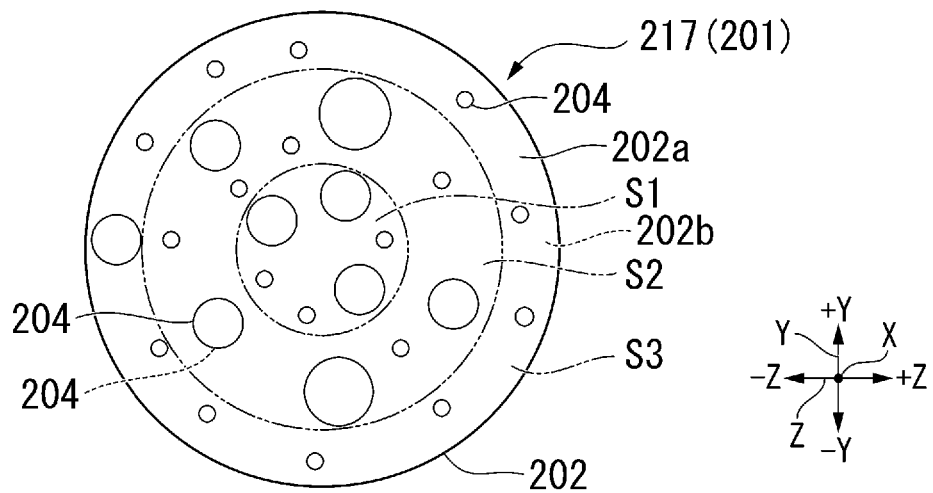
FIG. 8B is a plan view of the metasurface element shown in FIG. 8A.

A first modification of the metasurface element 216 of the second embodiment and the other aspect described above is a metasurface element 217 shown in FIGS. 8A and 8B. FIG. 8A is a side view of the metasurface element 217 of the first modification viewed from the Y direction. FIG. 8B is a plan view of the metasurface element 217 viewed from the X direction. As shown in FIGS. 8A and 8B, the metasurface element 217 is divided into a plurality of regions S1, S2, and S3 that are arranged in the radial direction of the plate surfaces 202a and 202b of the substrate 202. The amount of phase modulation of the blue laser light B that has passed through the region S1 closest to the center of the plate surfaces 202a and 202b is, for example, 0 to $2\pi$. The amount of phase modulation of the blue laser light B that has passed through the region S2 outside the region S1 of the plate surfaces 202a and 202b is, for example, 0 to $\pi$. The amount of phase modulation of the blue laser light B that has passed through the region S3 outside the region S2 of the plate surfaces 202a and 202b is, for example, 0 to $\pi/2$.

Similar to the first modification of the first embodiment, the metasurface element 217 of the first modification of the metasurface element 216 of the second embodiment and the other aspect described above is divided into a plurality of regions that are arranged in the radial direction when viewed from the X direction, that is, viewed from the optical axis AX1 shown in FIG. 2, and the maximum amount of phase modulation for the blue laser light B that has passed through each region becomes smaller as the region is more radially outward. Therefore, the angle of diffusion of the blue laser light DB emitted to the +X side by the plurality of microstructures 204 in a radially outer region of the plate surfaces 202a and 202b can be limited compared to in a radially inner region of the plate surfaces 202a. This reduces blue laser light DB that leaks outside the metasurface element 217 in the YZ plane, that is, outside a processing target region of the third light source module 1B, and thus can increase the utilization efficiency of the blue laser light DB.

Second Modification

Figure 9:
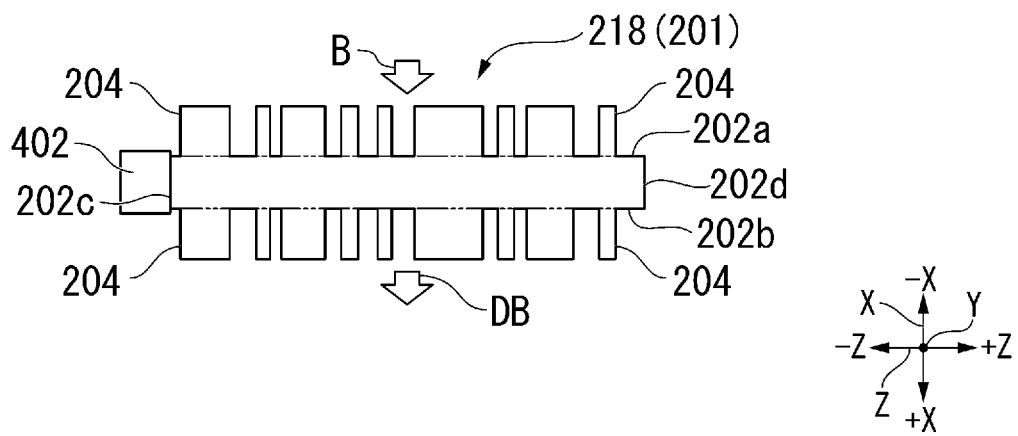
FIG. 9 is a side view of a second modification of the metasurface element shown in FIG. 7.

A second modification of the metasurface element 216 of the second embodiment and the other aspect described above is a metasurface element 218 shown in FIG. 9. FIG. 9 is a side view of the metasurface element 218 of the second modification viewed from the Y direction. As shown in FIG. 9, the metasurface element 218 is provided with a vibrator 402 on a side surface 202c of the substrate 202. As the vibrator 402 operates, the metasurface element 218 vibrates in an arbitrary direction parallel to the YZ plane and hardly vibrates in the X direction. The vibrator 402 may be provided at any position on the substrate 202 as long as it does not interfere with the blue laser light B and may be arranged, for example, on a side surface 202d of the substrate 202.

In the metasurface element 218 which is the second modification of the metasurface element 216 of the second embodiment and the other aspect described above, as the vibrator 402 operates, the positions of the microstructures 204 in the YZ plane change and therefore a phase modulation pattern for the incident blue laser light B changes with time, similar to the second modification of the first embodiment. Thus, a spatial distribution of phase modulation formed by the microstructures 204 changes with time and speckle noise components of the blue laser light DB are superimposed with time. The metasurface element 218 of the second modification uses the vibrator 402 to change the phase modulation pattern for the blue laser light B with time and thus can increase the effect of despeckling the blue laser light DB compared to the metasurface element 216 of the second embodiment.

Similar to the first modification, the metasurface element 218 of the second modification may be divided into a plurality of regions that are arranged in the radial direction when viewed from the X direction and the maximum amount of phase modulation for the blue laser light B that has passed through each region may become smaller as the region is more radially outward.

Third Modification

Figure 10:
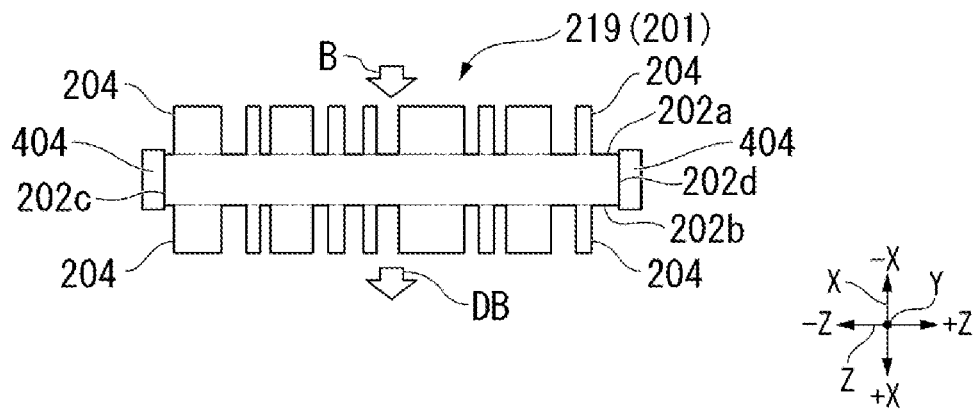
FIG. 10 is a side view of a third modification of the metasurface element shown in FIG. 7.

A third modification of the metasurface element 216 of the second embodiment and the other aspect described above is a metasurface element 219 shown in FIG. 10. FIG. 10 is a side view of the metasurface element 219 of the third modification viewed from the Y direction. As shown in FIG. 10, the metasurface element 219 is provided with a heater(s) 404 on the side surfaces 202c and 202d of the substrate 202. The plurality of microstructures 204 of the metasurface element 219 are formed of a material that transmits blue laser light B and contracts or expands to change in volume with changes in temperature or a material that transmits blue laser light B and undergoes a phase change to either an amorphous state or a crystalline state with changes in temperature. The volume change or phase change of the microstructures 204 is reversible with respect to temperature changes.

In the metasurface element 219 which is the third modification of the metasurface element 216 of the second embodiment and the other aspect described above, the heater 404 operates to change the temperature of at least the plurality of microstructures 204 within a range in which the material of the microstructures 204 can contract or expand to change the sizes of the microstructures 204 arranged on each of the plate surfaces 202a and 202b of the substrate 202, that is, the widths d and the heights t1 of the microstructures 204 and the intervals p between the microstructures 204, with the temperature, thus changing the amount of phase modulation $\phi_B$ for the blue laser light B, similar to the third modification of the first embodiment. Alternatively, the heater 404 operates to change the temperature of the plurality of microstructures 204 arranged on the plate surfaces 202a and 202b of the substrate 202 within a range in which phase can change between an amorphous state and a crystalline state to change the refractive power and the amount of phase modulation $\phi_B$ for the blue laser light B of each of the microstructures 204 arranged on the plate surfaces 202a and 202b of the substrate 202. The metasurface element 219 of the third modification changes the amount of phase modulation $\phi_B$ of the blue laser light B that has passed through the microstructures 204 of the metasurface element 214 with time through temperature control using the heater 404 to change the phase modulation pattern for the blue laser light B of the plurality of microstructures 204 with time. Thus, the metasurface element 219 of the third modification can increase the randomness of the phase modulation pattern for the blue laser light B and the effect of despeckling the blue laser light DB, compared to the metasurface element 216 of the second embodiment.

Similar to the first modification, the metasurface element 219 of the third modification may be divided into a plurality of regions that are arranged in the radial direction when viewed from the X direction and the maximum amount of phase modulation for the blue laser light B that has passed through each region may become smaller as the region is more radially outward.

Similar to the second modification, the metasurface element 219 of the third modification may further include a vibrator 402 that vibrates the substrate 202 and the plurality of microstructures 204 arranged on each of the plate surfaces 202a and 202b of the substrate 202 in a direction parallel to the YZ plane, the substrate 202 and the plurality of microstructures 204 being integrally formed with each other.

Third Embodiment

Next, a third embodiment of the present disclosure will be described with reference to FIG. 11.

Figure 11:
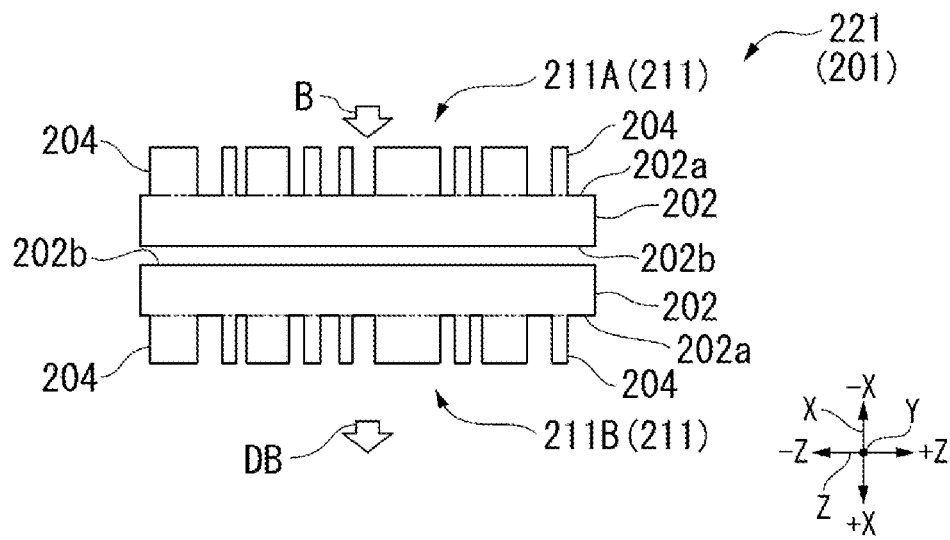
FIG. 11 is a side view of a metasurface element of a third embodiment applicable to the light source module shown in FIG. 2.

Although not shown, a third light source module 1B of the third embodiment includes a composite metasurface element 221 shown in FIG. 11 as a despeckle element 201 instead of the metasurface element 211 of the first embodiment in the third light source module 1B shown in FIG. 2. FIG. 11 is a side view of the composite metasurface element 221 of the third embodiment viewed from the Y direction.

As shown in FIG. 7, the composite metasurface element (a metasurface element) 221 includes a metasurface element (a first metasurface portion) 211A and a metasurface element (a second metasurface portion) 211B. Each of the metasurface elements 211A and 211B includes a substrate 202 and a plurality of microstructures 204 provided on a plate surface 202a of the substrate, similar to the metasurface element 211 of the first embodiment. In the composite metasurface element 221, a plate surface 202b of the substrate 202 of the metasurface element 211A and a plate surface 202b of the substrate 202 of the metasurface element 211B face each other with a gap therebetween in the X direction. In the composite metasurface element 221, the plurality of microstructures 204 provided on the plate surface 202a of the metasurface element 211A are aligned with the plurality of microstructures 204 provided on the plate surface 202a of the metasurface element 211B in the YZ plane.

As described above, the composite metasurface element 221 of the third embodiment includes the metasurface elements 211A and 211B. Each of the metasurface elements 211A and 211B includes the substrate (a base material) 202 having at least the plate surface 202a and the plurality of microstructures 204 arranged on the plate surface 202a. Each of the plurality of microstructures 204 has a width d in the YZ direction and a height t1 in the X direction perpendicular to the plate surface 202a. The width d and the height t1 are omitted in FIG. 11. At least one of the height t1 and the width d of the plurality of microstructures 204 of each of the metasurface elements 211A and 211B is set according to the amount of phase modulation $\phi_B$ for the blue laser light B that has passed through the plurality of microstructures 204. Similar to the metasurface element 211 of the first embodiment, the composite metasurface element 221 of the third embodiment is made of the substrate 202 and the microstructures 204 that have about the same dimensions as those of the wavelength band of the blue laser light B and thus can realize an ultrathin and small despeckle element 201 compared to a known diffusion plate or the like.

In the composite metasurface element 221 of the third embodiment, the metasurface elements 211A and 211B are arranged with a slight gap therebetween in the X direction such that the plate surfaces 202a of the substrates 202 of the metasurface elements 211A and 211B face each other. In the composite metasurface element 221 of the third embodiment, the plurality of microstructures 204 arranged on the plate surface 202a of the substrate 202 and the plurality of microstructures 204 arranged on the plate surface 202b are aligned with each other along the YZ plane parallel to the plate surfaces 202a and 202b. Similar to the metasurface element 216 of the second embodiment, the composite metasurface element 221 of the third embodiment can increase the range of the amount of phase modulation $\phi_B$ that depends on the height t1, compared to the single metasurface element 211 in which microstructures 204 are formed on the plate surface 202a of the substrate 202.

The plurality of microstructures 204 of the composite metasurface element 221 of the third embodiment are manufactured by a method such as RIE, EIB, or nanoimprint lithography as described in the first embodiment and the manufacturing difficulty increases as the height t1 increases. Even if it is difficult to process the plate surfaces 202a and 202b of the substrate 202, that is, to process both sides of the substrate 202 as in the case of manufacturing the metasurface element 216 of the second embodiment, the composite metasurface element 221 of the third embodiment can increase the range of the amount of phase modulation $\phi_B$ that depends on the height t1, compared to the single metasurface element 211. This can reduce the difficulty of manufacturing the metasurface elements 211A and 211B of the composite metasurface element 221 of the third embodiment, compared to the difficulty of manufacturing the metasurface element 211 of the first embodiment.

When the height t1 of the microstructures 204 formed on each of the plate surface 202a or the plate surface 202b of the substrate 202 of each of the metasurface elements 211A and 211B in the composite metasurface element 221 of the third embodiment is a dimension close to the manufacturing limit of the method such as RIE, EIB, or nanoimprint lithography, the amount of phase modulation $\phi_B$ accurately achieved by the composite metasurface element 216 of the second embodiment can be increased compared to the amount of phase modulation $\phi_B$ accurately achieved by the metasurface element 211 of the first embodiment.

In another aspect of the composite metasurface element 221 of the third embodiment, the plurality of microstructures 204 arranged on the plate surface 202a of the substrate 202 of the metasurface element 211A and the plurality of microstructures 204 arranged on the plate surface 202a of the metasurface element 211B may be displaced from each other along the YZ plane. Similar to the second embodiment, the amount of displacement of the plurality of microstructures 204 provided on the metasurface element 211B with respect to the plurality of microstructures 204 provided on the metasurface element 211A is appropriately adjusted to such an extent that it does not eliminate the interval between the microstructures 204 provided on the metasurface elements 211A and 211B when viewed in the X direction and is preferably set to such an extent that it does not reduce the randomness of the phase modulation pattern achieved by the plurality of microstructures 204.

In the composite metasurface element 221 of the third embodiment and the other aspect described above, a plurality of microstructures 204 are arranged on each of the plate surfaces 202a of the substrates 202 of the metasurface elements 211A and 211B, but one or at least one microstructure 204 may be arranged on each of the plate surfaces 202a of the substrates 202.

First Modification

In a first modification of the composite metasurface element 221 of the third embodiment and the other aspect described above, at least one of the metasurface elements 211A and 211B may be divided into a plurality of regions that are arranged in the radial direction of the plate surface 202a of the substrate 202 although not shown. In the first modification of the composite metasurface element 221, the maximum amount of phase modulation for the blue laser light B that has passed through each region may become smaller as the region is more radially outward when viewed from the X direction, that is, viewed from the optical axis AX1 shown in FIG. 2.

In the first modification of the composite metasurface element 221 of the third embodiment and the other aspect described above, the angle of diffusion of the blue laser light DB emitted to the +X side by the plurality of microstructures 204 in a radially outer region of the plate surface 202a can be limited compared to in a radially inner region of the plate surface 202a. The first modification of the composite metasurface element 221 reduces blue laser light DB that leaks outside the composite metasurface element 221 in the YZ plane, that is, outside a processing target region of the third light source module 1B including the composite metasurface element 221, and thus can increase the utilization efficiency of the blue laser light DB.

Second Modification

Figure 12:
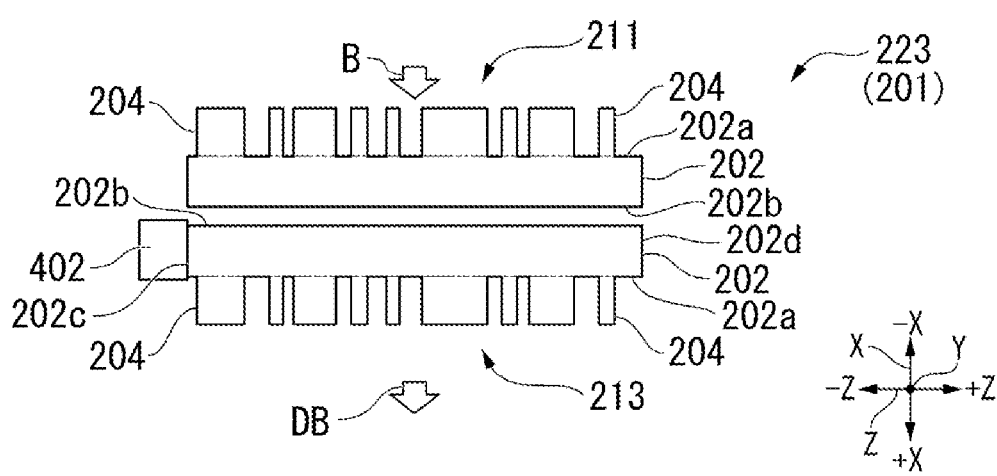
FIG. 12 is a side view of a second modification of the metasurface element shown in FIG. 11.

A second modification of the composite metasurface element 221 of the third embodiment and the other aspect described above is a composite metasurface element 223 shown in FIG. 12. FIG. 12 is a side view of the composite metasurface element 223 of the second modification viewed from the Y direction. The composite metasurface element 223 of the second modification is provided with a vibrator 402 on a side surface 202c of a substrate 202 of a metasurface element 213. That is, in the composite metasurface element 223 of the second modification, a plate surface 202b of a substrate 202 of a metasurface element 211 and a plate surface 202b of the substrate 202 of the metasurface element 213 face each other in the X direction with a gap therebetween in the X direction as shown in FIG. 12.

In the composite metasurface element 223, the plurality of microstructures 204 provided on the plate surface 202a of the metasurface element 211 are aligned with the plurality of microstructures 204 provided on the plate surface 202a of the metasurface element 213 in the YZ plane. As the vibrator 402 operates, the metasurface element 213 vibrates in an arbitrary direction parallel to the YZ plane and hardly vibrates in the X direction. The vibrator 402 may be provided at any position on the substrate 202 as long as it does not interfere with the blue laser light B and may be arranged, for example, on a side surface 202d of the substrate 202.

In the composite metasurface element 223 which is the second modification of the composite metasurface element 221 of the third embodiment and the other aspect described above, as the vibrator 402 operates, the positions of the microstructures 204 of the metasurface element 213 in the YZ plane change and therefore a phase modulation pattern for the incident blue laser light B changes with time, similar to the second modification of the second embodiment. Thus, a spatial distribution of phase modulation formed by the microstructures 204 of the metasurface element 213 changes with time and speckle noise components of the blue laser light DB are superimposed with time. The composite metasurface element 223 of the second modification uses the vibrator 402 to change the phase modulation pattern for the blue laser light B with time and thus can increase the effect of despeckling the blue laser light DB compared to the composite metasurface element 221 of the third embodiment and the other aspect described above.

According to the composite metasurface element 223 of the second modification, the vibrator 402 is provided on the side surface 202c of the substrate 202 of at least one of the metasurface elements 211A and 211B of the composite metasurface element 221 of the third embodiment. That is, the vibrator 402 may be provided on the side surface 202c of the substrate 202 of the metasurface element 211 in addition to on that of the metasurface element 213 of the composite metasurface element 221 of the third embodiment. The vibrator 402 may also be provided on the side surface 202c of the substrate 202 of only the metasurface element 211 among the metasurface elements 211 and 213 of the composite metasurface element 221 of the third embodiment.

Similar to the first modification, at least one of the metasurface elements 211 and 213 of the composite metasurface element 223 of the second modification may be divided into a plurality of regions that are arranged in the radial direction when viewed from the X direction and the maximum amount of phase modulation for the blue laser light B that has passed through each region may become smaller as the region is more radially outward.

Third Modification

Figure 13:
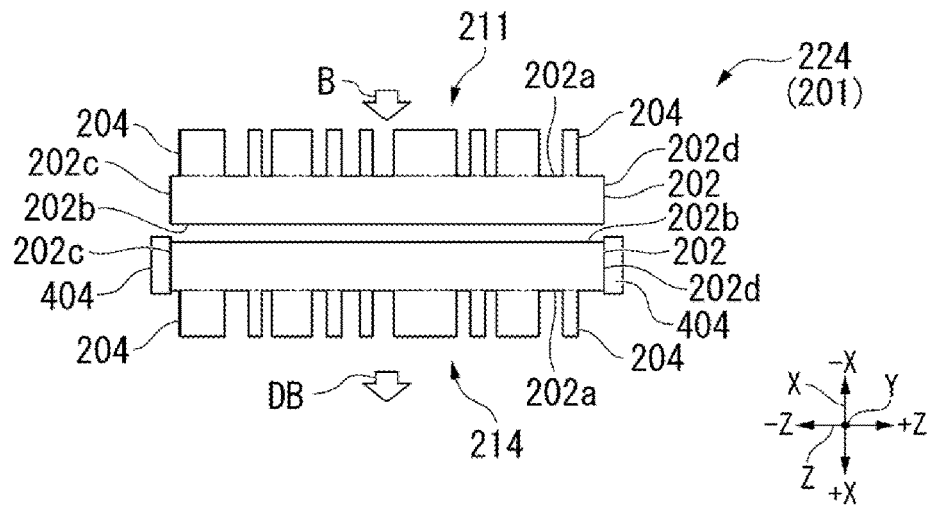
FIG. 13 is a side view of a third modification of the metasurface element shown in FIG. 11.

A third modification of the composite metasurface element 221 of the third embodiment and the other aspect described above is a composite metasurface element 224 shown in FIG. 13. FIG. 13 is a side view of the composite metasurface element 224 of the third modification viewed from the Y direction. According to the composite metasurface element 224 of the third modification, a heater 404 is provided on the side surfaces 202c and 202d of the substrate 202 of the metasurface element 211B among the metasurface elements 211A and 211B of the composite metasurface element 221 of the third embodiment. According to the composite metasurface element 224 of the third modification, the plurality of microstructures 204 provided on the plate surface 202a of the substrate 202 of the metasurface element 211B of the composite metasurface element 221 of the third embodiment are formed of a material that transmits blue laser light B and contracts or expands to change in volume with changes in temperature or a material that transmits blue laser light B and undergoes a phase change to either an amorphous state or a crystalline state with changes in temperature. The volume change or phase change of the microstructures 204 is reversible with respect to temperature changes. That is, in the composite metasurface element 224 of the third modification, the plate surface 202b of the substrate 202 of the metasurface element 211 and the plate surface 202b of the substrate 202 of the metasurface element 214 face each other in the X direction with a gap in the X direction as shown in FIG. 13.

In the composite metasurface element 224 which is the third modification of the composite metasurface element 221 of the third embodiment and the other aspect described above, the heater 404 operates to change the temperature of at least the plurality of microstructures 204 of the metasurface element 214 within a range in which the material of the microstructures 204 can contract or expand to change the sizes of the microstructures 204 arranged on each of the plate surface 202a of the substrate 202 of the metasurface element 214, that is, the widths d and the heights t1 of the microstructures 204 and the intervals p between the microstructures 204, with the temperature, thus changing the amount of phase modulation $\phi_B$ for the blue laser light B, similar to the third modification of the second embodiment. Alternatively, the heater 404 operates to change the temperature of the plurality of microstructures 204 arranged on the plate surface 202a of the substrate 202 of the metasurface element 214 within a range in which phase can change between an amorphous state and a crystalline state to change the refractive power and the amount of phase modulation $\phi_B$ for the blue laser light B of each of the microstructures 204 arranged on the plate surface 202a of the substrate 202 of the metasurface element 214. The composite metasurface element 224 of the third modification changes the amount of phase modulation $\phi_B$ of the blue laser light B that has passed through the microstructures 204 with time through temperature control using the heater 404 to change the phase modulation pattern for the blue laser light B of the plurality of microstructures 204 of the metasurface element 214 with time. Thus, the composite metasurface element 224 of the third modification can increase the randomness of the phase modulation pattern for the blue laser light B and the effect of despeckling the blue laser light DB, compared to the composite metasurface element 221 of the third embodiment.

According to the composite metasurface element 224 of the third modification, the heater 404 is provided on the side surfaces 202c and 202d of the substrate 202 of at least one of the metasurface elements 211A and 211B of the composite metasurface element 221 of the third embodiment and the plurality of microstructures 204 of the at least one of the metasurface elements are formed of a material that transmits blue laser light B and contracts or expands to change in volume with changes in temperature or a material that transmits blue laser light B and undergoes a phase change to either an amorphous state or a crystalline state with changes in temperature. That is, the heater 404 may be provided on the side surface 202c of the substrate 202 of the metasurface element 211A in addition to on that of the metasurface element 211B of the composite metasurface element 221 of the third embodiment and the plurality of microstructures 204 of the metasurface elements 211A and 221B may be formed of a material that transmits blue laser light B and contracts or expands to change in volume with changes in temperature or a material that transmits blue laser light B and undergoes a phase change to either an amorphous state or a crystalline state with changes in temperature. The heater 404 may also be provided on the side surface 202c of the substrate 202 of only the metasurface element 211A among the metasurface elements 211A and 211B of the composite metasurface element 221 of the third embodiment and the plurality of microstructures 204 of the metasurface element 211A may be formed of a material that transmits blue laser light B and contracts or expands to change in volume with changes in temperature or a material that transmits blue laser light B and undergoes a phase change to either an amorphous state or a crystalline state with changes in temperature.

Similar to the first modification, at least one of the metasurface elements 211 and 214 of the composite metasurface element 224 of the third modification may be divided into a plurality of regions that are arranged in the radial direction when viewed from the X direction and the maximum amount of phase modulation for the blue laser light B that has passed through each region may become smaller as the region is more radially outward.

Similar to the second modification, at least one of the metasurface elements 211 and 214 of the composite metasurface element 224 of the third modification may further include a vibrator 402 that vibrates the substrate 202 of the metasurface element 211 or 214 and the plurality of microstructures 204 arranged on the plate surface 202a of the substrate 202 in a direction parallel to the YZ plane, the substrate 202 and the plurality of microstructures 204 being integrally formed with each other.

In the composite metasurface element 221 of the third embodiment and the first modification, the composite metasurface element 223 of the second modification of the third embodiment, the composite metasurface element 224 of the third modification of the third embodiment, each of the metasurface elements 211A, 211, and 211 and a corresponding one of the metasurface elements 211B, 213, and 214 which face each other in the X direction may be adhered to each other with an adhesive (not shown).

In the composite metasurface element 221 of the third embodiment and the first modification, the composite metasurface element 223 of the second modification of the third embodiment, and the composite metasurface element 224 of the third modification of the third embodiment, the thicknesses, that is, the sizes in the X direction, of each of the metasurface elements 211A, 211, and 211 and a corresponding one of the metasurface elements 211B, 213, and 214 which face each other in the X direction can be made within the dimensions of the order of wavelengths to achieve ultrathinness. Therefore, each of the metasurface elements 211A, 211, and 211 and a corresponding one of the metasurface elements 211B, 213, and 214 can be collectively and compactly arranged at the position PS3 that is substantially conjugate to the position PS4.

Fourth Embodiment

Figure 14:
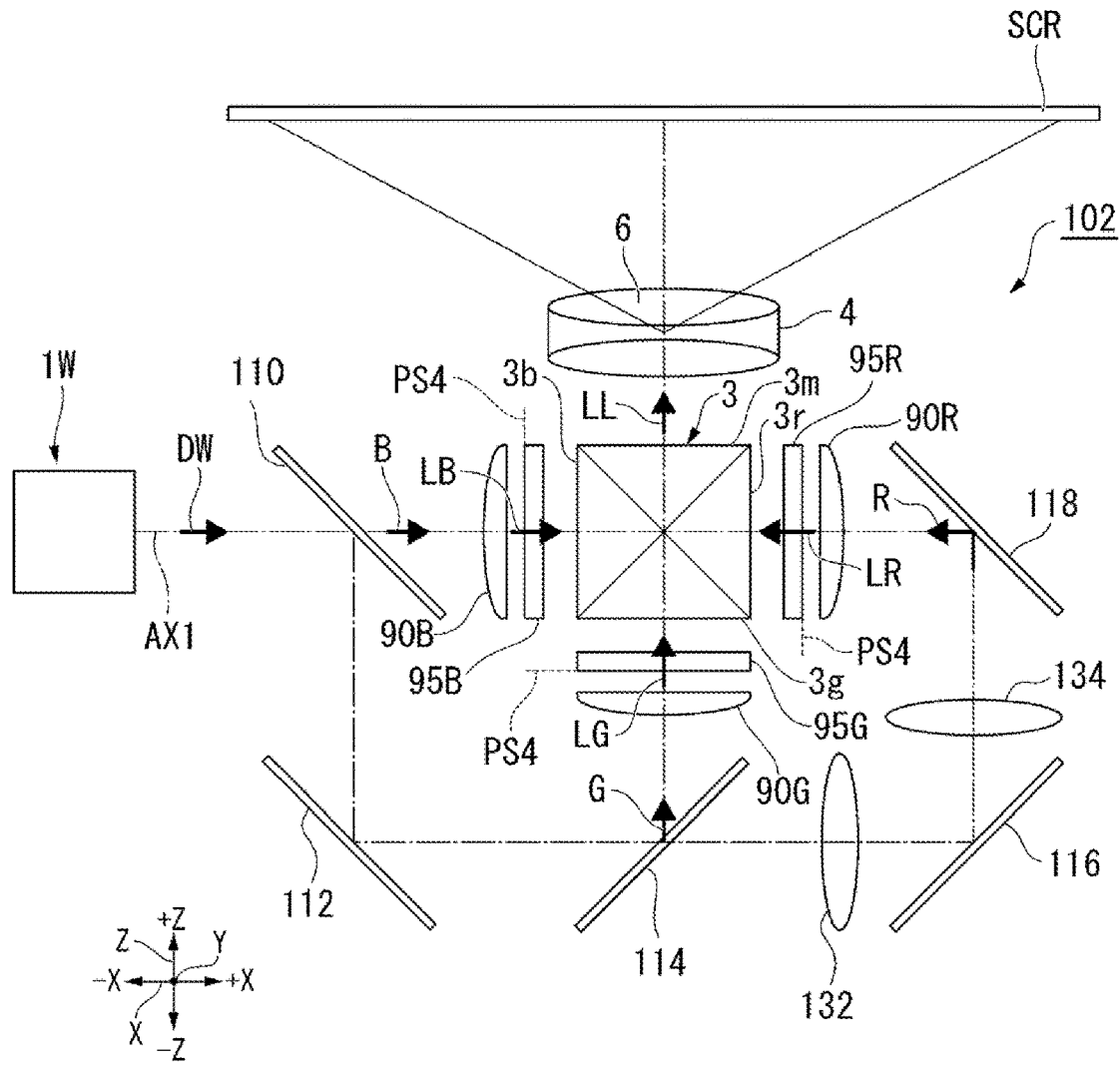
FIG. 14 is a schematic configuration diagram of a projector according to a fourth embodiment.

Next, a fourth embodiment of the present disclosure will be described with reference to FIGS. 14 to 17.
Projector FIG. 14 is a schematic configuration diagram of a projector 102 of the fourth embodiment. The projector 102 is a projection-type image display device that projects an image onto a screen SCR, similar to the projector 100 of the first embodiment. As shown in FIG. 14, the projector 102 includes a white light source module 1W for white, field lenses 90B, 90G and 90R, dichroic mirrors 110 and 114, reflection mirrors 112, 116 and 118, relay lenses 132 and 134, light modulation elements 95B, 95G, and 95R, a cross dichroic prism 3, and a projection optical system (a projection device) 4.

The white light source module 1W emits white light (light) DW obtained by combining yellow light YY, which includes red light and green light, and blue laser light DB. A configuration of the white light source module 1W will be described later.

The white light DW emitted from the white light source module 1W is separated into red light, green light, and blue light through the dichroic mirrors 110 and 114, the reflection mirrors 112, 116, and 118, and the relay lenses 132 and 134 and the separated red light, green light, and blue light are guided to the light modulation elements 95B, 95G and 95R, respectively.

The dichroic mirror 110 passes blue light BB out of the white light DW which is incident from the −X side along an optical axis AX1 and reflects green light GG and red light RR, that is, yellow light. Each of the blue light BB, the green light GG, and the red light RR included in the white light DW is emitted from the white light source module 1W in a state where measures for despeckling have been taken for it. The reflection mirror 112 reflects substantially all of the incident green light GG and red light RR. The dichroic mirror 114 reflects the green light GG out of the incident green light GG and red light RR and passes the red light RR. Each of the reflection mirrors 116 and 118 reflects substantially all of the incident red light RR.

The field lenses 90B, 90G, and 90R face side surfaces 3b, 3g, and 3r of the cross dichroic prism 3 in optical paths of the blue light BB, the green light GG, and the red light RR, respectively, and are arranged on the −X side, the −Z side, and the +X side of the side surfaces 3b, 3g, and 3r, respectively. The light modulation elements 95B, 95G, and 95R are disposed between the field lenses 90B, 90G, and 90R and the cross dichroic prism 3 in the optical paths of the blue light BB, the green light GG, and the red light RR, respectively.

Each of the field lenses 90B, 90G, and 90R is arranged in front of a superimposing lens 82 in the white light source module 1W, which will be described later, in the traveling direction of the white light DW at a predetermined interval from the superimposing lens 82 in an optical path of the white light DW. The field lenses 90B, 90G, and 90R align the traveling directions of outer peripheral portions in the YZ plane of the blue light BB, the green light GG, and the red light RR included in the white light DW emitted from the superimposing lenses 82 and emit the aligned blue light BB, green light GG, and red light RR to the +X side in the X direction. The field lenses 90B, 90G, and 90R limit attenuation and definition reduction of the incident white light DW.

The blue light BB that has passed through the dichroic mirror 110 passes through the field lens 90B and is incident on an image forming region of the light modulation element 95B. The green light GG reflected by the dichroic mirror 110 is reflected sequentially by the reflection mirror 112 and the dichroic mirror 114, passes through the field lens 90G, and is incident on an image forming region of the light modulation element 95G. The red light RR reflected by the dichroic mirror 110 is reflected by the reflection mirror 112 and passes through the dichroic mirror 114 and then is reflected sequentially by the reflection mirrors 116 and 118, passes through the field lens 90R, and is incident on an image forming region of the light modulation element 95R.

Each of the light modulation elements 95B, 95G, and 95R is made of a liquid crystal panel that forms an image by modulating a corresponding one of incident blue light BB, green light GG, and red light RR according to image information. The operation mode of the liquid crystal panel may be any of a TN mode, a VA mode, a horizontal electric field mode, and the like and is not limited to any particular mode. Each of the light modulation elements 95R, 95G, and 95B includes an incident-side polarizing plate (not shown) arranged on a light incident surface side and an exit-side polarizing plate (not shown) arranged on a light exit surface side. The light modulation elements 95B, 95G, and 95R generate blue image light LB, green image light LG, and red image light LR, respectively.

The image light LB emitted from the light modulation element 95B is incident on the side surface 3b of the cross dichroic prism 3 from the −X side parallel to the X direction. The image light LG emitted from the light modulation element 95G is incident on the side surface 3g of the cross dichroic prism 3 from the −Z side parallel to the Z direction. The image light LR emitted from the light modulation element 95R is incident on the side surface 3r of the cross dichroic prism 3 from the +X side parallel to the X direction. The cross dichroic prism 3 combines the image light beams emitted from the light modulation elements 95B, 95G, and 95R to form a color image.

Combined light LL obtained by the cross dichroic prism 3 is emitted to the +Z side in the Z direction and projected onto the screen SCR by the projection optical system 4, similar to the projector 100 of the first embodiment. An enlarged image is displayed on the screen SCR.

Light Source Module

Figure 15:
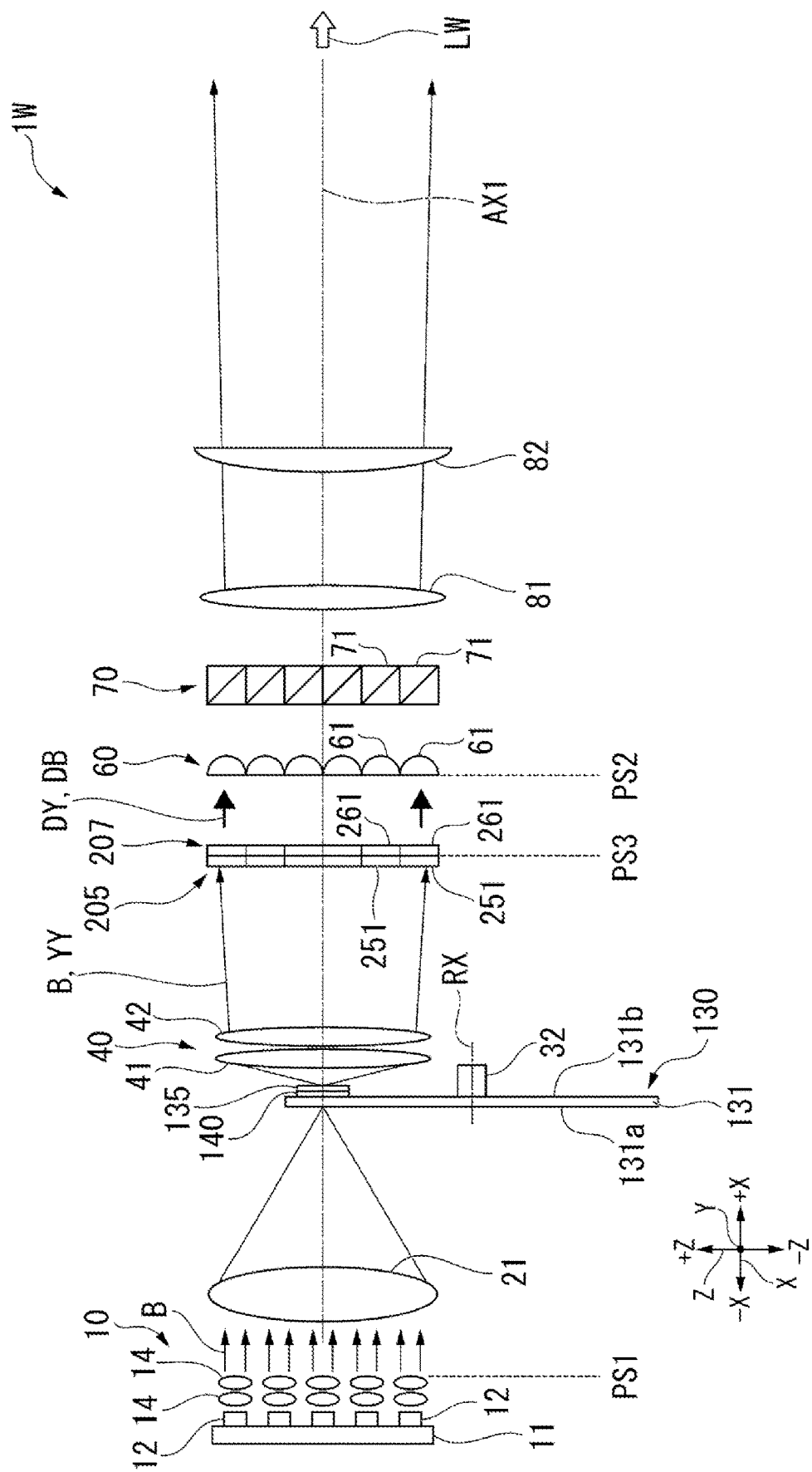
FIG. 15 is a schematic configuration diagram of a light source module of the fourth embodiment.

FIG. 15 is a schematic configuration diagram of the white light source module 1W of the fourth embodiment. As shown in FIG. 15, the white light source module 1W includes a light source unit 10, a focusing lens 21, a fluorescence rotating element 130, a pickup optical system 40, despeckle focusing elements 205 and 207, a second lens array 60, a polarization conversion element 70, and superimposing lenses 81 and 82. These constituent elements are arranged in the white light source module 1W in the order listed from the −X side to the +X side in the X direction.

The blue laser light B focused by the focusing lens 21 is incident on the fluorescence rotating element 130. The fluorescence rotating element 130 includes a disc 131, a phosphor layer 135, a dichroic film 140, and a motor 32. The disc 131 extends in the YZ plane and has circular plate surfaces 131a and 131b when viewed in the X direction. The disc 131 is configured to be rotatable about a rotation axis RX passing through the center of the plate surface 131b on the +X side by a motor 32 provided on the plate surface 131b. The disc 131 is formed of a material that transmits at least the blue laser light B. Examples of materials for the disc 131 include quartz, crystal, sapphire, optical glass, and transparent resin.

A diffusion element (not shown) may be arranged between the focusing lens 21 and the fluorescence rotating element 130 in the X direction. The diffusion element is formed larger than the beam diameter of the blue laser light B in a plane parallel to the YZ plane and may be made of a diffusion plate similar to the diffusion element 30 described in the first embodiment.

The phosphor layer 135 is disposed on the plate surface 131b of the disc 131 via the dichroic film 140 in the X direction. The phosphor layer 135 is provided in a region of the plate surface 131a which radially overlaps the optical axis AX1 throughout the circumference of the plate surface 131b. The blue laser light B that has passed through the disc 131 and the dichroic film 140 is incident on the phosphor layer 135.

The phosphor layer 135 generates yellow light YY by using at least part of the incident blue laser light B as excitation light. The yellow light YY has a yellow wavelength band (a second wavelength band) different from the blue wavelength band of the visible wavelength band and includes green light and red light. The phosphor layer 135 is made of, for example, a layer containing $(Y, Gd)_3(Al, Ga)_5O_{12}:Ce$ which is a type of YAG phosphor. The dichroic film 140 is provided between the disc 131 and the phosphor layer 135 in the X direction and transmits the blue laser light B and reflects the yellow light YY.

At least part of the remaining blue laser light B (at least part of the light in a first wavelength band) that is incident on the phosphor layer 135 from the −X side passes through the phosphor layer 135. Another part of the blue laser light B incident on the phosphor layer 135 is backscattered and emitted to the −X side. The yellow light YY generated by the phosphor layer 135 and emitted to the −X side is reflected by the dichroic film 140, passes through the phosphor layer 135, and travels to the +X side along the optical axis AX1. The blue laser light B transmitted through the phosphor layer 135 and the yellow light YY generated by the wavelength conversion function of the phosphor layer 135 are emitted from the phosphor layer 135 to the +X side along the optical axis AX1.

The despeckle focusing elements 205 and 207 are arranged on the +X side of the second lens 42 of the pickup optical system 40 at a predetermined interval in the X direction from the pickup optical system 40. The despeckle focusing elements 205 and 207 are arranged in the optical axis AX1 at a position PS3 that is conjugate to the position PS4 of the image forming region of each of the light modulation elements 95B, 95G and 95R.

The despeckle focusing elements 205 and 207 have a plurality of metasurface elements 251 and 261 for splitting the blue laser light DB and the yellow light YY emitted from the pickup optical system 40 into a plurality of partial beams in the YZ plane. Each metasurface element 251 acts as a despeckle element for the incident blue laser light B, and similar to the microlenses 51 described in the first embodiment, acts as a focusing lens for the incident yellow light YY. Each metasurface element 261 acts as a focusing lens only for the incident blue laser light B, similar to the microlenses 51. Thus, the blue laser light B and the yellow light YY that have passed through the despeckle focusing elements 205 and 207 are despeckled and split into a plurality of partial light beams in the YZ plane. The metasurface elements 251 and 261 will be described below.

The plurality of metasurface elements 251 and 261 are disposed in the Y and Z directions in the YZ plane. The despeckle focusing elements 205 and 207 emit the blue laser light DB and yellow light DY split into a plurality of partial light beams to the +X side in the X direction.

A plurality of microlenses 61 of the second lens array 60 are arranged to correspond to the plurality of metasurface elements 251 and 261 of the despeckle focusing elements 205 and 207. The second lens array 60, together with the superimposing lenses 81 and 82, causes images of the plurality of metasurface elements 251 and 261 of the despeckle focusing elements 205 and 207 to be formed in the vicinity of the image forming regions of the light modulation elements 95B, 95G and 95R.

The polarization conversion element 70 converts each partial light beam split by the despeckle focusing elements 205 and 207 into predetermined linearly polarized light according to the characteristics of each of the light modulation elements 95B, 95G and 95R. The despeckle focusing elements 205 and 207, the second lens array 60, and the superimposing lenses 81 and 82 constitute an integrator optical system that uniformizes an in-plane light intensity distribution of the blue laser light B and the yellow light YY or the light LL in the image forming region of the projector 102.

The white light LW emitted from the white light source module 1W is incident on the cross dichroic prism 3 through the side surface 3b in the projector 102 shown in FIG. 14.

In the projector 102, the blue laser light B is despeckled at the position PS3, such that the despeckling effect occurs strongly in the blue light BB incident on the light modulation element 95B at the position PS4 as shown in FIGS. 14 and 15. Because the image light LB, LG, and LR is formed from the blue light BB and the incoherent green light GG and red light RR, which have already been despeckled at the position PS4, measures for despeckling are effectively taken for the light LL projected onto the screen SCR that has been described with reference to FIG. 14.

Despeckle Focusing Element

As shown in FIG. 15, the despeckle focusing element 205 includes a plurality of metasurface elements 251 arranged in the Y and Z directions in the YZ plane. When the blue laser light B and the yellow light YY incident from the −X side are each split into a plurality of partial light beams in the YZ plane as described above, the size and the total number of metasurface elements 251 in the YZ plane correspond respectively to the beam diameter of each partial light beam and the number of divided partial light beams and are equal respectively to the size of each microlens 61 of the second lens array 60 in the YZ plane and the total number of microlenses 61 arranged in the YZ plane.

Figure 16:
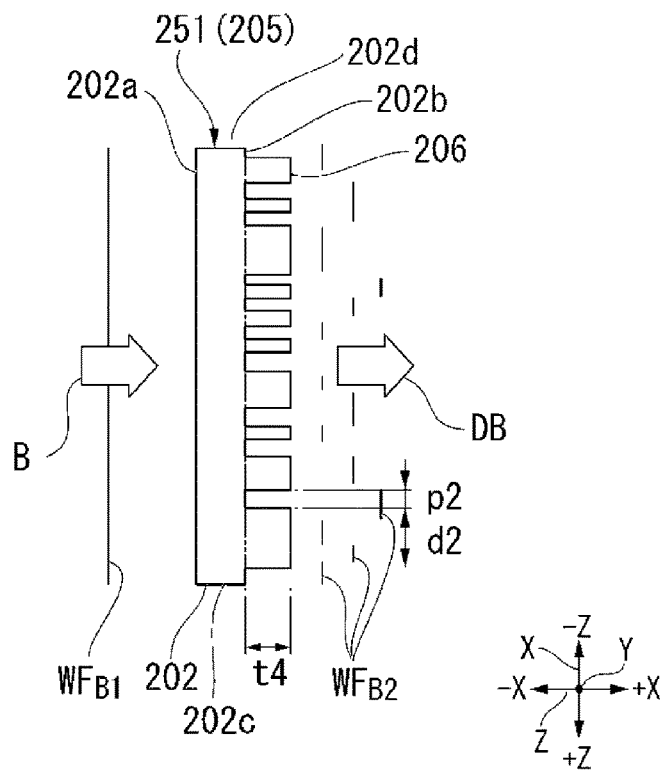
FIG. 16 is a side view showing a configuration of a metasurface element of the fourth embodiment applicable to the light source module shown in FIG. 15 and the behavior of blue laser light when the blue laser light is incident on the metasurface element.
Figure 17:
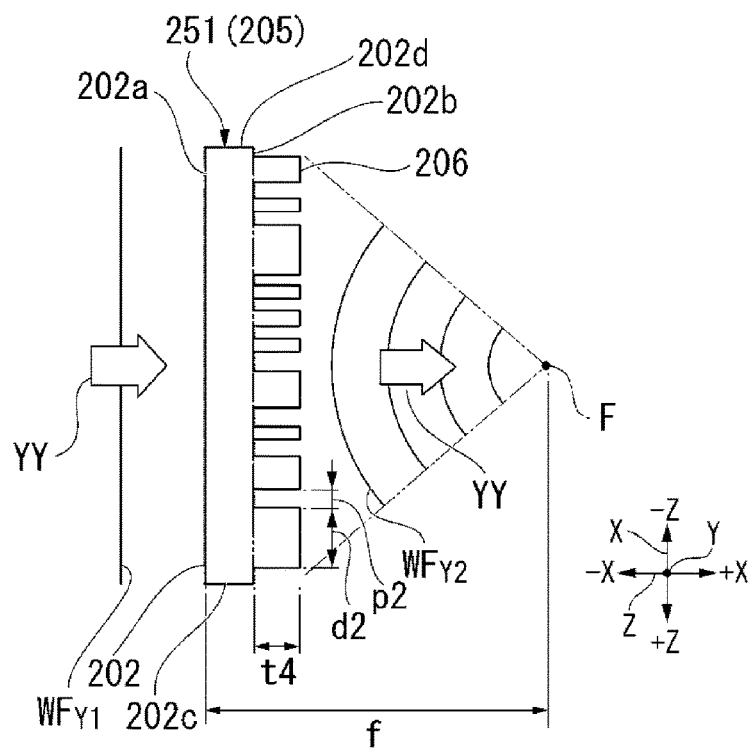
FIG. 17 is a side view showing the behavior of yellow light when the yellow light is incident on the metasurface element shown in FIG. 16.

FIG. 16 is a side view showing how the blue laser light B is incident on each metasurface element 251 of the fourth embodiment. FIG. 17 is a side view showing a state when the yellow light YY is incident on each metasurface element 251. As shown in FIGS. 16 and 17, the metasurface element 251 includes a substrate (a base material) 202 having plate surfaces 202a and 202b parallel to the YZ plane and a plurality of microstructures 206 provided on the plate surface 202b.

A microstructure 206 has a width d2 in a direction parallel to the plate surface 202b and a height t4 in the X direction perpendicular to the plate surface 202b (which is a direction crossing the reference surface). The metasurface element 251 includes a plurality of microstructures 206. The widths d2 and heights t4 of the plurality of microstructures 206 and the intervals p2 between the microstructures 206 may be the same or different.

The metasurface element 251 randomly modulates the phase of the blue laser light B expanded and substantially collimated by the pickup optical system 40 for each position within the region of the metasurface element 251 in the YZ plane. As shown in FIG. 16, each equiphase surface $WF_{B1}$ of the blue laser light B incident on the metasurface element 251 is distributed parallel to the YZ plane. A plurality of equiphase surfaces $WF_{B1}$ are distributed at regular interval in the X direction. FIG. 16 illustrates one equiphase surface $WF_{B1}$ out of the plurality of equiphase surfaces $WF_{B1}$ distributed in the X direction. The blue laser light DB that has passed through the metasurface element 251 has a plurality of equiphase surfaces $WF_{B2}$ dispersed in the X direction which are produced as an equiphase surface $WF_{B1}$ is divided into short parts in the YZ plane. Such a plurality of equiphase surfaces $WF_{B2}$ produce blue laser light DB having a random phase distribution. As a result, the despeckle focusing element 205 made of the metasurface element 251 randomly modulates the phase of the incident blue laser light B and emits the phase-modulated blue laser light DB to the despeckle focusing element 207.

On the other hand, the metasurface element 251 converges the phases of the yellow light YY expanded and substantially collimated by the pickup optical system 40 to the focal point F on the +X side. As shown in FIG. 17, each equiphase surface $WF_{Y1}$ of the yellow light YY incident on the metasurface element 251 is distributed parallel to the YZ plane, similar to the equiphase surface $WF_{B1}$ of the blue laser light B. A plurality of equiphase surfaces $WF_{Y1}$ are distributed at regular interval in the X direction. FIG. 17 illustrates one equiphase surface $WF_{Y1}$ out of the plurality of equiphase surfaces $WF_{Y1}$ distributed in the X direction. The yellow light YY that has passed through the metasurface element 251 has an equiphase surface $WF_{Y2}$ curved with respect to the YZ plane which is produced as the equiphase surface $WF_{Y1}$ converges toward the focal point F which is at a position separated to the +X side in the X direction from the plate surface 202b on the +X side of the substrate +X 202 by a predetermined focal length. A plurality of equiphase surfaces $WF_{Y2}$ are distributed at regular radial interval about the focal point F. Such a plurality of equiphase surfaces $WF_{Y2}$ produces yellow light YY focused at the focal point F. As a result, the despeckle focusing element 205 made of the metasurface element 251 converges the phases of the incident yellow light YY toward the focal point F to focus the yellow light YY to the focal point F while emitting the yellow light YY to the microlens 61 of the second lens array 60 through the despeckle focusing element 207.

The focal point F of the yellow light YY of the metasurface element 251 is located within the region of a microlens 61 corresponding to the metasurface element 251 in the YZ plane. The blue laser light B and the yellow light YY incident on the metasurface element 251 from the −X side are confined in the microstructures 206 having the width d2, the height t4, and the interval p2 and resonate due to the light confinement as described above. In a region that the metasurface element 251 occupies in the YZ plane, a random amount of phase modulation $\phi_B$ and an amount of phase modulation $\phi_Y$ for forming an image of the yellow light YY are caused respectively to the blue laser light DB, which has been emitted from and despeckled by the plurality of microstructures 206, and the focused yellow light YY.

The width d2 and the height t4 of each microstructure 206 of the metasurface element 251 and the interval p2 between each microstructure 206 are set such that the metasurface element 251 achieves an amount of phase modulation $\phi_B$ suitable for randomly modulating the phase of the blue laser light B that has passed through the microstructures 206 as described above according to the peak wavelength of the blue laser light B and at the same time achieves an amount of phase modulation $\phi_Y$ suitable for focusing the yellow light YY that has passed through the microstructures 206 to the focal point F as described above according to the peak wavelength of the yellow light YY.

The despeckle focusing element 207 includes a plurality of metasurface elements 261 arranged in the Y and Z directions in the YZ plane. When the blue laser light DB incident from the −X side is split into a plurality of partial light beams in the YZ plane as described above, the size and the total number of metasurface elements 261 in the YZ plane correspond respectively to the beam diameter of each partial light beam and the number of divided partial light beams and are equal respectively to the size of each microlens 61 of the second lens array 60 in the YZ plane and the total number of microlenses 61 arranged in the YZ plane.

Although not shown, the metasurface element 261 includes a substrate (a base material) 202 having plate surfaces 202a and 202b parallel to the YZ plane and a plurality of microstructures 206 provided on the plate surface 202b, similar to the metasurface element 251.

However, the metasurface element 261 converges the phases of the blue laser light B emitted from and despeckled by the metasurface element 251 to the focal point F on the +X side. On the other hand, the metasurface element 261 does not affect the phase of the yellow light YY emitted from the metasurface element 251 and focused at the focal point F.

The blue laser light DB and the yellow light YY incident on the metasurface element 261 from the −X side are confined in the microstructures 206 having the width d2, the height t4, and the interval p2 and resonate due to the light confinement as described above. An amount of phase modulation $\phi_B$ for forming an image of the blue laser light DB is caused to the focused blue laser light emitted from the plurality of microstructures 206 in a region that the metasurface element 261 occupies in the YZ plane.

The width d2 and the height t4 of each microstructure 206 of the metasurface element 261 and the interval p2 between each microstructure 206 are set such that the metasurface element 261 achieves an amount of phase modulation $\phi_B$ suitable for focusing the blue laser light DB that has passed through the microstructures 206 at the focal point F and at the same time achieves a situation where the yellow light YY that has passed through the microstructures 206 is not phase-modulated.

The predetermined values of the width d2, the height t4, and the interval p2 of the microstructures 206 of the metasurface elements 251 and 261 do not excessively exceed dimensions that equipment used for manufacturing the metasurface elements 251 and 261 based on the method such as RIE, EIB, or nanoimprint lithography can manufacture and process with high precision and low yield for the material of the microstructures 206 and is preferably set taking into account such dimensions.

It is preferable that the material of the microstructures 206 of the metasurface elements 251 and 261 have a high refractive index and a low absorption with respect to at least the yellow light YY in addition to the blue laser light B. The material of the microstructures 206 having a high refractive index with respect to the blue laser light B and the yellow light YY can increase the amounts of phase modulation $\phi_B$ and $\phi_Y$ that can be achieved for a given height t4, increasing the freedom of design of the microstructures 206. It is preferable that the material of the microstructures 206 be, for example, $TiO_2$, SiN, or the like which absorbs less light in the visible wavelength band.

Electromagnetic wave analysis such as the FDTD method is used to analyze behaviors when the blue laser light B and the yellow light YY are incident on each of the metasurface elements 251 and 261 for which the width d2 and the height t4 of each microstructure 206 and the interval p2 between each microstructure 206 have been set as described above. In particular, because the metasurface elements 251 and 261 implement completely different functions for the blue laser light B and the yellow light YY which are two light beams of different wavelength bands, design evaluation for checking whether the functions work together as desired is important for good operation of the white light source module 1W and the projector 102.

Here, a design guideline based on the structure of the metasurface element 251 that implements the focusing function will be described. When λ is the central wavelength of the yellow light YY, f is the predetermined focal length of the plate surface 202b of the substrate 202 in the X direction, and coordinate values y and z are taken in the y and Z directions with respect to the center of the metasurface element 251 in its surface parallel to the YZ plane as the origin, a phase distribution ψ(y, z, λ) required for the metasurface element 251 is expressed by the following equation (1).

[Math. 1]

$$\varphi(y, z, \lambda) = C(\lambda) - \frac{2\pi}{\lambda}\left(\sqrt{y^2 + z^2 + f^2} - f\right) \tag{1}$$

C(λ) in equation (1) is a constant that varies with the wavelength λ and is determined based on the aperture area of the metasurface element 251. After that, the width d2 and the height t4 of each microstructure 206 and the interval p2 between the plurality of microstructures 206 are adjusted based on equation (1). Specifically, any one of the parameters of the width d2, the height t4, and the interval p2 of the microstructures 206 is changed within a predetermined range and its relationship with the phase of the yellow light YY emitted from the microstructures 206 is calculated using a simulation based on electromagnetic wave analysis such as the FDTD.

Figure 18:
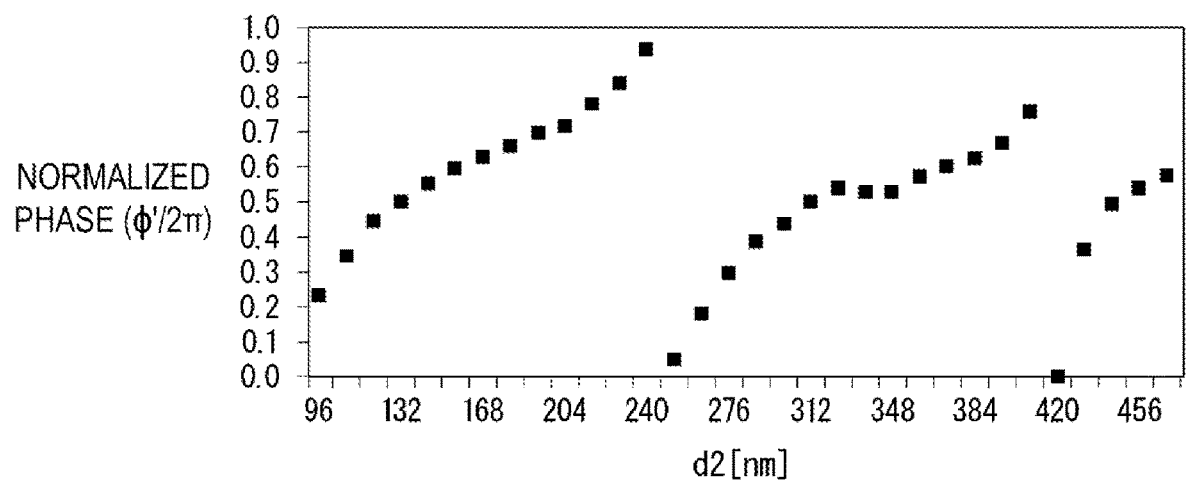
FIG. 18 is a graph showing an example of the relationship between the phase and the width of each microstructure of the metasurface element shown in FIG. 16.

FIG. 18 is a graph showing an example of a result obtained through an FDTD-based simulation of the relationship between the width d2 of the microstructures 206 and the phase $\phi$ of light emitted from the microstructure 206. In this simulation, the wavelength λ was set to 550 nm and the focal length f was set to 250 μm. Although not shown, in a structural model of this simulation, a light receiver was virtually placed on the same side of the metasurface element 251 as the light sources in a direction corresponding to the X direction, that is, a direction parallel to the optical axis of the incident light. That is, in this simulation, the incident light reciprocates in a microstructure 206 having the height t4 in a direction parallel to the optical axis and is given the amount of phase modulation $\phi'$ that is about twice the amount of phase modulation $\phi$ that can be achieved at the height t4. The vertical axis of the graph in FIG. 18 represents a phase ($\phi'/2\pi$) normalized by $2\pi$.

As shown in FIG. 18, as the width d2 of the microstructure 206 increases, the amount of phase modulation $\phi'$ increases nonlinearly and continuously from 0 to a maximum value near $2\pi$. As the width d2 further increases after the amount of phase modulation $\phi'$ reaches the maximum value, the amount of phase modulation $\phi'$ suddenly decreases discontinuously to near 0 and increases nonlinearly and continuously from near 0 to a maximum value and such discontinuous sudden decrease and continuous increase repeat. The maximum value of the amount of phase modulation $\phi'$ decreases as the width d2 increases.

Figure 19:
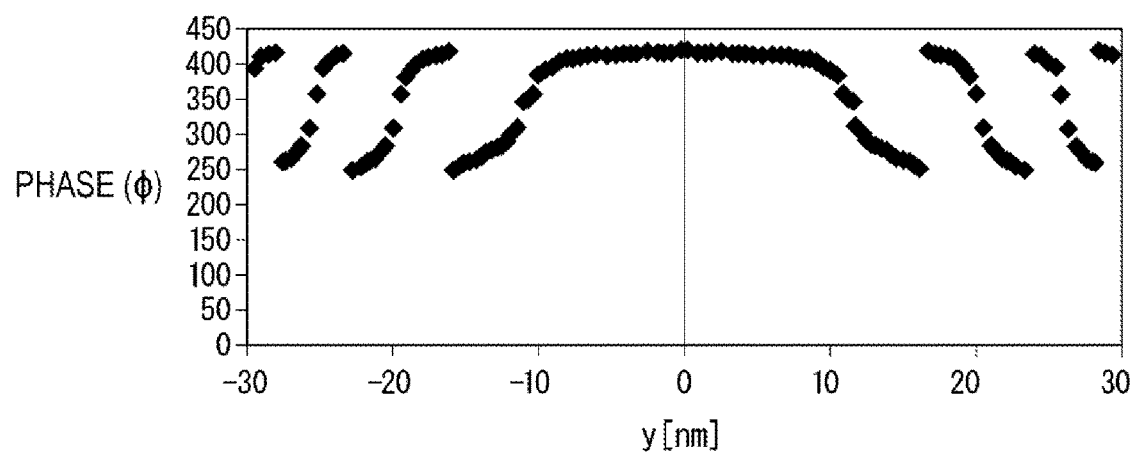
FIG. 19 is a graph showing an example of a phase distribution of the metasurface element shown in FIG. 16.

Next, the width d2 and the height t4 of each of the plurality of microstructures 206 and the intervals p2 between the microstructures 206 from which the phase distribution ψ(y, z, λ) of equation (1) is obtained are determined from simulation results including the calculation results illustrated in FIG. 18. FIG. 19 shows an example of the phase distribution ψ(y, z, λ) calculated for the structural model of the metasurface element 251. After calculating the phase distribution ψ(y, z, λ) in this way, the wavefront shape of light emitted from the structural model of the metasurface element 251 and a light intensity distribution at a focal point F that is virtually placed at a position advanced from the structural model in the optical axis direction by the focal length f are calculated similarly using an FDTD-based simulation. The calculated results are verified and the width d2 and the height t4 of each of the plurality of microstructures 206 and the interval p2 between each microstructure 206 are optimized.

Each of the metasurface elements 251 and 261 of the fourth embodiment described above includes the substrate 202 and at least one microstructure 206 arranged on the plate surface 202b of the substrate 202. Features of the metasurface elements 251 and 261 of the fourth embodiment that are common with the metasurface element 211 of the first embodiment have operational effects similar to those of the metasurface element 211.

In the metasurface element 251 of the fourth embodiment, at least one of the height t4 and the width d2 of each microstructure 206 is determined such that the blue laser light (light) B that has passed through the microstructure 206 is randomly phase-modulated and the yellow light YY that has passed through the microstructure 206 is focused by a lens function that narrows a wide radiation angle due to Lambertian emission. As compared to the blue laser light B, the yellow light YY has green and red wavelengths different from the blue wavelength of the blue laser light B and is an example of "light having a second wavelength different from a first wavelength" in the claims that will be described later. In the metasurface element 261 of the fourth embodiment, at least one of the height t4 and the width d2 of each microstructure 206 is determined such that no phase modulation is given to the yellow light (light) YY that has passed through the microstructure 206 and the blue laser light DB that has passed through the microstructure 206 is focused. As compared to the yellow light YY, the blue laser light B has a blue wavelength different from the red and green wavelengths of the yellow light YY and is an example of "light having a second wavelength different from a first wavelength" in the claims that will be described later. The metasurface element 261 of the fourth embodiment emits blue laser light DB that has been despeckled and focused and yellow light DY toward the microlenses 61 of the second lens array 60.

The metasurface elements 251 and 261 of the fourth embodiment can obtain different amounts of phase modulation $\phi_B$ and $\phi_Y$ for the blue laser light B and the yellow light YY having different wavelengths through microstructures 206 having common absolute dimensions according to at least one of the height t4 and the width d2 of each microstructure 206. Each of the metasurface elements 251 and 261 of the fourth embodiment can exhibit a despeckle function for one of the blue laser light B and the yellow light YY having different wavelengths and a focusing function for the other through the single element by using the characteristics described above. The lens function implemented by each of the metasurface elements 251 and 261 of the fourth embodiment causes little chromatic aberration unlike refractive lenses because it focuses the yellow light YY or the blue laser light DB by the light confinement effect and the resonance phenomenon in the microstructure 206 as described above.

Each of the metasurface elements 251 and 261 of the fourth embodiment uses a plurality of microstructures 206 in which a plurality of resonance modes such as a guided mode resonance, which couples a Fabry-Perot resonance in the X direction and a resonance in a direction parallel to the YZ plane caused by diffraction due to a periodic structure of the microstructures 206, occur for the blue laser light B or the yellow light YY. Therefore, the amounts of phase modulation $\phi_B$ and $\phi_Y$ discontinuously and randomly change rather than continuously changing in a direction parallel to the YZ plane with respect to at least one of the height t4 and the width d2 of each microstructure 206. Thus, according to each of the metasurface elements 251 and 261 of the fourth embodiment, it is possible to easily design an ultrathin and small element having different optical functions at different wavelengths.

According to the projector 102 of the fourth embodiment, it is possible to effectively take measures for despeckling the light LL projected onto the screen SCR while limiting an increase in the size of the white light source module 1W because the ultrathin and small despeckle focusing elements 205 and 207 made of the metasurface elements 251 and 261 are arranged in the white light source module 1W. In particular, in the case where the size and weight of the projector 102 are reduced, the white light source module 1W is extremely limited in its space where a despeckle focusing element can be arranged. Even in such a case, the despeckle focusing elements 205 and 207 made of the plurality of metasurface elements 251 and 261 can be easily arranged at the position PS3 or other desired positions where the despeckling effect of the white light source module 1W can be strongly exhibited.

In the above-described metasurface elements 251 and 261 of the fourth embodiment, the plurality of microstructures 206 of the metasurface element 251 are aligned with the plurality of microstructures 206 of the metasurface element 261 in a direction parallel to the YZ plane. The plurality of microstructures 206 of the metasurface element 251 may also be displaced from the plurality of microstructures 206 of the metasurface element 261 in a direction parallel to the YZ plane. The amount of displacement is appropriately adjusted to such an extent that it does not eliminate the intervals between the microstructures 206 provided on the metasurface elements 251 and 261 when viewed in the X direction and does not affect the splitting of each of the blue laser light B and the yellow light YY into a plurality of partial light beams in the YZ plane and is preferably set to such an extent that it does not reduce the randomness of the phase modulation pattern achieved by the plurality of microstructures 206.

In the metasurface elements 251 and 261 of the fourth embodiment, microstructures 206 are provided only on the plate surface 202b of the substrate 202, but may also be provided only on, for example, the plate surface 202a. The microstructures 206 of the metasurface element 251 may be provided only on one of the plate surfaces 202a and 202b of the substrate 202 and the microstructures 206 of the metasurface element 261 may be provided on the other of the plate surfaces 202a and 202b of the substrate 202.

First and Second Modifications

Although not shown, the metasurface elements 251 and 261 of the fourth embodiment may be provided with a vibrator 402 at any position on the substrate 202 of at least one of the metasurface elements 251 and 261, similar to the second modification of the third embodiment.

Although not shown, the microstructures 204 of at least one of the metasurface elements 251 and 261 of the fourth embodiment may be formed of a material that transmits blue laser light B and yellow light YY and contracts or expands to change in volume with changes in temperature or a material with a phase that changes to either an amorphous state or a crystalline state with changes in temperature, similar to the third modification of the third embodiment.

The metasurface elements 251 and 261 of the modifications of the fourth embodiment described above can change the amount of phase modulation $\phi_B$ of the blue laser light B that has passed through the microstructure 206 with time to change the phase modulation pattern for the blue laser light B with time. Thus, according to the metasurface elements 251 and 261 of the modifications of the fourth embodiment, it is possible to increase the randomness and the despeckling effect of the phase modulation pattern for the blue laser light B and the yellow light YY.

It is preferable that the +X-side end surface of the despeckle focusing element 205 made of the plurality of metasurface elements 251 be in contact with the −X-side end surface of the despeckle focusing element 207 made of the plurality of metasurface elements 261. The despeckle focusing elements 205 and 207 may be arranged at a slight interval in the X direction. The slight interval indicates such a short interval that both the +X-side end surface of the despeckle focusing element 205 and the −X-side end surface of the despeckle focusing element 207 are considered to be arranged at the position PS3 that will be described later in the X direction.

In the fourth embodiment and modifications thereof, the metasurface elements 251 and 261 can be collectively and compactly arranged at the position PS3 that is substantially conjugate to the position PS4 because the thicknesses, that is, the sizes in the X direction, of the metasurface elements 251 and 261 can be made within the dimensions of the order of wavelengths to achieve ultrathinness. Another modification is a configuration in which three or more metasurface elements are arranged side by side with their thickness directions parallel to the X direction and each of the metasurface elements has different optical functions at different wavelengths. Even with such a configuration, a plurality of metasurface elements can be easily collectively and compactly arranged at a position that is substantially conjugate to the position of the image forming region of the light modulation element in the optical path. For example, three metasurface elements may be arranged side by side, of which the first may focus blue light and despeckle yellow light, the second may despeckle blue light and red light and focus green light, and the third may despeckle blue light and green light and focus red light.

Fifth Embodiment

Next, a fifth embodiment of the present disclosure will be described with reference to FIGS. 20 to 22.

Figure 20:
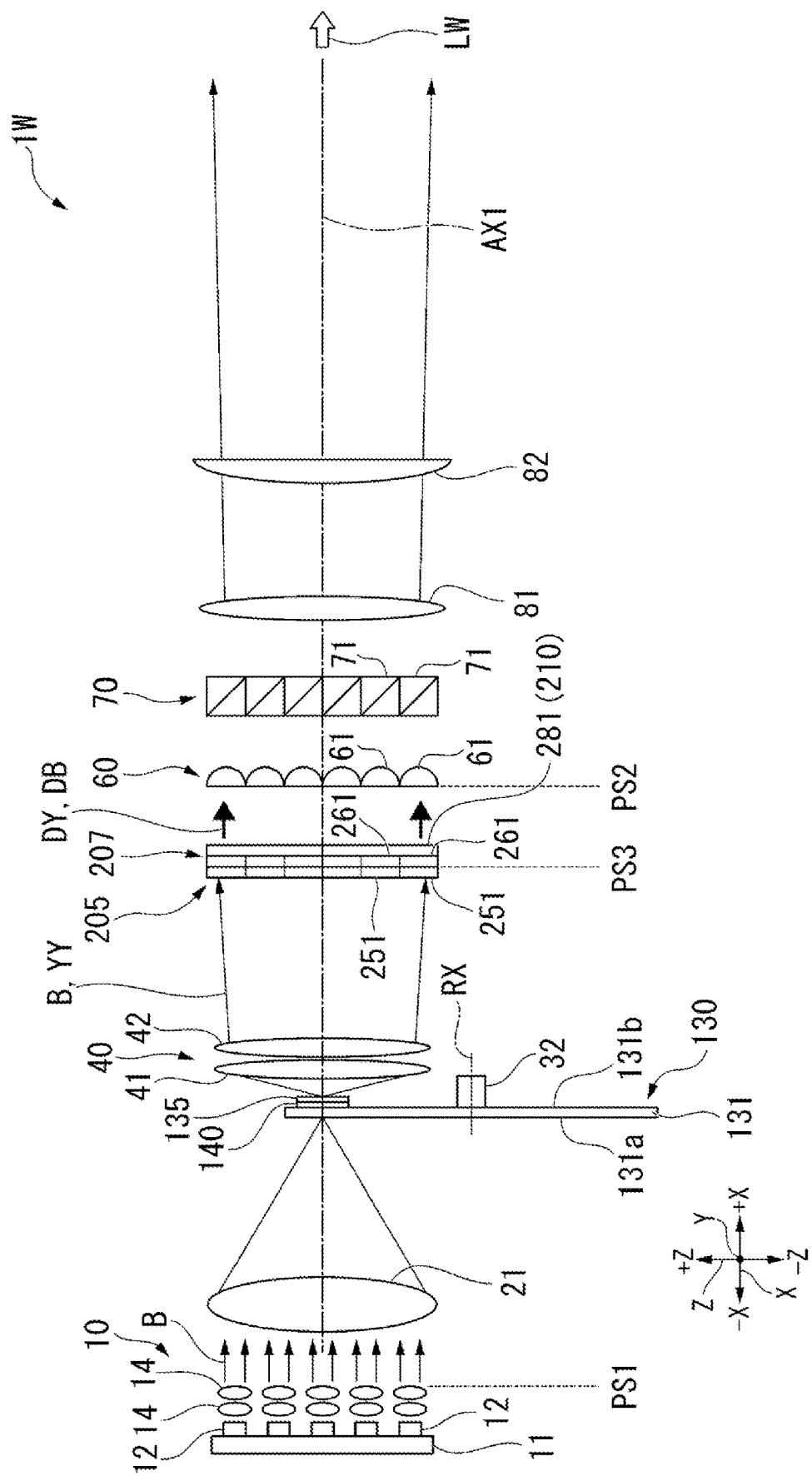
FIG. 20 is a schematic configuration diagram of a light source module of a fifth embodiment.

Although not shown, a projector 102 of the fifth embodiment replaces the white light source module 1W of the projector 102 of the fourth embodiment with a white light source module 1W1 shown in FIG. 20.
Light Source Module FIG. 20 is a schematic configuration diagram of the white light source module 1W1 of the fifth embodiment. As shown in FIG. 20, the white light source module 1W1 includes a light source unit 10, a focusing lens 21, a fluorescence rotating element 130, a pickup optical system 40, despeckle focusing elements 205 and 207, a despeckle wavelength filter 210, a second lens array 60, a polarization conversion element 70, and superimposing lenses 81 and 82. These constituent elements are arranged in the white light source module 1W1 in the order listed from the −X side to the +X side in the X direction.

The despeckle wavelength filter 210 is disposed adjacent to the despeckle focusing element 207 on the +X side of the despeckle focusing element 207. Blue laser light DB and yellow light DY emitted from the despeckle focusing element 207 to the +X side in the X direction are incident on the despeckle wavelength filter 210.

The despeckle wavelength filter 210 includes a metasurface element 281. The metasurface element 281 limits the intensity of the blue laser light DB emitted from the despeckle focusing element 207 and adjusts a spectral distribution of white light LW obtained by combining the blue laser light DB and the yellow light DY. That is, the metasurface element 281 acts as a wavelength filter on the incident blue laser light DB and does not act on the incident yellow light DY. A configuration of the metasurface element 281 will be described later.

The despeckle wavelength filter 210 emits the blue laser light DB with reduced light intensity and the despeckled yellow light DY to the +X side in the X direction, which are then incident on the second lens array 60.
Despeckle Wavelength Filter FIG. 21 is a side view showing how the blue laser light DB is incident on the metasurface element 281 of the fifth embodiment. As shown in FIG. 21, the metasurface element 281 includes a substrate (a base material) 202 having plate surfaces 202a and 202b parallel to the YZ plane and a plurality of microstructures 208 provided on the plate surface 202b.

Each microstructure 208 has a width d3 in a direction parallel to the plate surface 202b and a height t5 in the X direction perpendicular to the plate surface 202b (which is a direction crossing the reference surface). The widths d3 and heights t5 of the plurality of microstructures 206 and the intervals p3 between the microstructures 206 may be the same or different.

The metasurface element 281 reduces the transmitted light intensity of the blue laser light DB while randomly modulating the phase of the blue laser light DB despeckled by the despeckle focusing element 205 and then focused by the despeckle focusing element 207 for each position within the region of the metasurface element 281 in the YZ plane. The blue laser light DB incident on the metasurface element 281 resonates in the plurality of microstructures 208 more strongly than in the microstructures 204 and 206. The transmitted light intensity of the blue laser light DB is lower than that of the metasurface element 211 and the metasurface elements 251 and 261 because of a strong light confinement effect due to the resonance.

Figure 21:
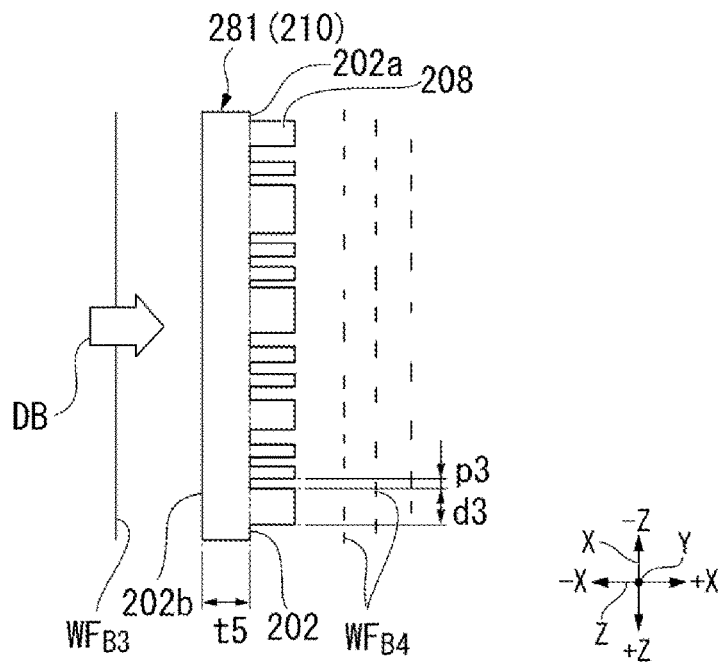
FIG. 21 is a side view showing a configuration of a metasurface element of the fifth embodiment applicable to the light source module shown in FIG. 20 and the behavior of blue laser light when the blue laser light is incident on the metasurface element.

As shown in FIG. 21, when it is assumed that each equiphase surface $WF_{B3}$ of the blue laser light DB incident on the metasurface element 281 is distributed parallel to the YZ plane and that a plurality of equiphase surfaces $WF_{B3}$ are distributed at regular interval in the X direction, the blue laser light DB transmitted through the metasurface element 281 has a plurality of equiphase surfaces $WF_{B4}$ dispersed in the X direction which are produced as an equiphase surface $WF_{B3}$ is divided into short parts in the YZ plane. The light intensity of the blue laser light DB having such a plurality of equiphase surfaces $WF_{B4}$ is reduced. As a result, the despeckle wavelength filter 210 made of the metasurface element 281 randomly modulates the phase of the incident blue laser light DB while reducing the transmitted light intensity of the blue laser light DB and emits the resulting blue laser light DB to the +X side in the X direction toward the second lens array 60 shown in FIG. 20.

The width d3 and height t5 of each microstructure 208 of the metasurface element 281 and the interval p3 between each microstructure 208 are set such that the microstructure 208 achieves an amount of phase modulation $\phi_B$ suitable for randomly modulating the phase of the blue laser light B that has passed through the microstructures 208 while reducing the transmitted light intensity of the blue laser light DB with an increase in the light confinement effect of the blue laser light DB as described above according to the peak wavelength of the blue laser light B and also such that the microstructure 208 does not affect the yellow light YY that has passed through the microstructure 208 according to the peak wavelength of the yellow light YY.

Figure 22:
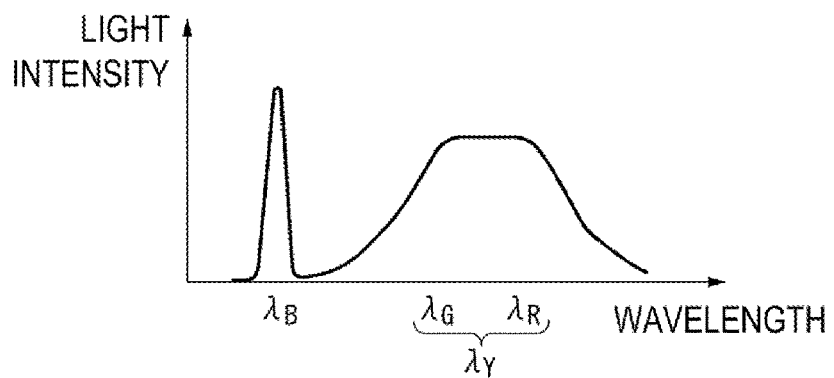
FIG. 22 is a schematic diagram of a spectral distribution of blue laser light incident on the metasurface element shown in FIG. 21.
Figure 23:
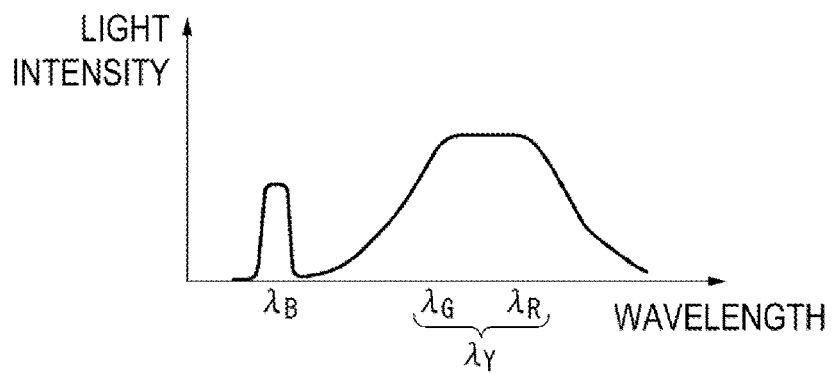
FIG. 23 is a schematic diagram of a spectral distribution of blue laser light emitted from the metasurface element shown in FIG. 21.

FIG. 22 is a schematic diagram of spectral distributions of blue laser light DB and yellow light DY incident on the metasurface element 281. FIG. 23 is a schematic diagram of spectral distributions of blue laser light DB and yellow light DY emitted from the metasurface element 281. As shown in FIGS. 22 and 23, the peak of the spectrum distribution of the blue laser light DB, which has a blue wavelength $\lambda_B$ as a peak wavelength, among the light emitted from the metasurface element 281 is lowered due to a much stronger resonance phenomenon of the blue laser light DB than the yellow light YY in the microstructures 208. On the other hand, the spectral distribution of the yellow light DY, which has a band of yellow wavelengths $\lambda_Y$ including green wavelengths $\lambda_G$ and red wavelengths $\lambda_R$, is kept substantially equal to that when the yellow light DY is incident, although it is slightly reduced overall due to the phenomenon of the resonance of the yellow light DY in the microstructures 208.

The predetermined values of the width d3, the height t5, and the interval p3 of the microstructures 208 of the metasurface element 281 do not excessively exceed dimensions that equipment used for manufacturing the metasurface element 281 based on the method such as RIE, EIB, or nanoimprint lithography can manufacture and process with high precision and low yield for the material of the microstructures 208 and is preferably set taking into account such dimensions.

It is preferable that the material of the microstructures 208 of the metasurface element 281 have a high refractive index and a low absorption with respect to at least the blue laser light DB and the yellow light DY. The material of the microstructures 208 having a high refractive index with respect to the blue laser light DB and the yellow light DY can increase the amounts of phase modulation $\phi_B$ and $\phi_Y$ that can be achieved for a given height t5, increasing the freedom of design of the microstructures 208. It is preferable that the material of the microstructures 208 be, for example, $TiO_2$, SiN, or the like which absorbs less light in the visible wavelength band.

Similar to the fourth embodiment, the metasurface element 281 implements completely different functions for the blue laser light DB and the yellow light DY which are two light beams of different wavelength bands. Therefore, electromagnetic wave analysis such as the FDTD method is used to analyze behaviors when the blue laser light DB and the yellow light DY are incident on the metasurface element 281 for which the width d3 and the height t5 of each microstructure 208 and the interval p3 between each microstructure 208 have been set as described above.

The metasurface element 281 of the fifth embodiment described above includes the substrate 202 and at least one microstructure 208 arranged on the plate surface 202b of the substrate 202. Features of the metasurface element 281 of the fifth embodiment that are common with the metasurface element 211 of the first embodiment have operational effects similar to those of the metasurface element 211.

In the metasurface element 281 of the fifth embodiment, the height t5 and the width d3 of each microstructure 208 are determined such that the yellow light (light) DY that has passed through the microstructure 208 is not phase-modulated and the light intensity of the blue laser light DB that has passed through the microstructure 208 when it is emitted is reduced compared to when it is incident. As compared to the blue laser light DB, the yellow light DY has green and red wavelengths different from the blue wavelength of the blue laser light DB and is an example of "light having a second wavelength different from a first wavelength" in the claims that will be described later. The metasurface element 281 of the fifth embodiment emits blue laser light DB, which has been despeckled and focused while being reduced in the light intensity, and focused yellow light DY toward the microlenses 61 of the second lens array 60.

The metasurface element 281 of the fifth embodiment can obtain different amounts of phase modulation $\phi_B$ and $\phi_Y$ for the blue laser light DB and the yellow light DY having different wavelengths through microstructures 208 having common absolute dimensions according to at least one of the height t5 and the width d3 of each microstructure 208. The metasurface element 281 of the fifth embodiment can also obtain an attenuated amount of light intensity due to the phenomenon of the resonance of the blue laser light DB according to at least one of the height t5 and the width d3 of the microstructure 208. The metasurface element 281 of the fifth embodiment can exhibit a despeckle function for one of the blue laser light DB and the yellow light DY having different wavelengths and can reduce the light intensity of the other of the blue laser light DB and the yellow light DY when it is emitted compared to when it is incident and exhibit a despeckle function for the other, through the single element by using the characteristics described above.

The metasurface element 281 of the fifth embodiment can implement, for example, a wavelength filter function that reduces the transmitted light intensity (the light intensity) of light in a specific wavelength band such as blue laser light DB having a blue wavelength $\lambda_B$ and hardly reduces the transmitted light intensity of light having another wavelength band, for example, yellow light DY, with the single element. Thus, it is possible to limit the light intensity of blue laser light DB having a greater light intensity than yellow light DY caused by yellow light YY generated by the principle of fluorescence and adjust the balance between the blue laser light DB and the yellow light DY and the color balance of the white light LW. According to the metasurface element 281 of the fifth embodiment, it is possible to easily design an ultrathin and small element having different optical functions at different wavelengths.

According to the projector 102 of the fifth embodiment, it is possible to effectively take measures for despeckling the light LL projected onto the screen SCR while limiting an increase in the size of the white light source module 1W1 because the ultrathin and small despeckle wavelength filter 210 made of the metasurface element 281 is arranged in the white light source module 1W1. In particular, in the case where the size and weight of the projector 102 are reduced, the white light source module 1W1 is extremely limited in its space where the despeckle focusing elements 205 and 207 can be arranged. Even in such a case, the despeckle element, the focusing element, and the wavelength filter made of the plurality of metasurface elements 251, 261, and 281 can be easily arranged at the position PS3 or other desired positions where the despeckling effect of the white light source module 1W1 can be strongly exhibited.

In the metasurface element 281 of the fifth embodiment, microstructures 208 are provided only on the plate surface 202b of the substrate 202, but may also be provided only on, for example, the plate surface 202a.

First and Second Modifications

Although not shown, the metasurface element 281 of the fifth embodiment may be provided with a vibrator 402 at any position on the substrate 202, similar to the second modification of the third embodiment.

Although not shown, the microstructures 208 of the metasurface element 281 of the fifth embodiment may be formed of a material that transmits blue laser light B and yellow light YY and contracts or expands to change in volume with changes in temperature or a material with a phase that changes to either an amorphous state or a crystalline state with changes in temperature, similar to the third modification of the third embodiment.

The metasurface element 281 of the modifications of the fifth embodiment described above can change the amount of phase modulation $\phi_B$ of the blue laser light DB that has passed through the microstructure 208 with time to change the phase modulation pattern for the blue laser light DB with time. Thus, according to the metasurface element 281 of the modifications of the fifth embodiment, it is possible to increase the randomness and the despeckling effect of the phase modulation pattern for the blue laser light DB.

In the fifth embodiment and modifications thereof, the metasurface elements 251, 261, and 281 can be collectively and compactly arranged at the position PS3 that is substantially conjugate to the position PS4 because the thicknesses, that is, the sizes in the X direction, of the metasurface elements 251, 261, and 281 can be made within the dimensions of the order of wavelengths to achieve ultrathinness. The metasurface elements 251, 261, and 281 of the fifth embodiment and modifications thereof correspond to the exemplary configuration described in the fourth embodiment in which three or more metasurface elements are arranged side by side.

The metasurface element 281 of the modification of the fifth embodiment may be arranged adjacent to and on the −X side of the despeckle element 201 of, for example, any one or two light source modules, in which the light source unit 10 emits a greater light intensity of light than that of the other light source modules, among the first to third light source modules 1R, 1G, and 1B of the first embodiment. For example, when the despeckle wavelength filter 210 made of the metasurface element 281 is arranged adjacent to and on the −X side of the despeckle element 201 of the third light source module 1B for blue, the light intensity of blue laser light DB emitted from the third light source module 1B can be reduced below that of green laser light and red laser light emitted from the first and second light source modules 1R and 1G.

Sixth Embodiment

Next, a sixth embodiment of the present disclosure will be described with reference to FIG. 24.

Although not shown, a projector 100 of the sixth embodiment replaces the third light source module 1B of the projector 100 of the first embodiment with a third light source module 1B1 described below.

Although not shown, the third light source module 1B1 of the sixth embodiment includes a light source unit 10, a focusing lens 21, a diffusion element 30, a pickup optical system 40, a despeckle element 209, a reflection mirror, a first lens array 50, a second lens array 60, a polarization conversion element 70, superimposing lenses 81 and 82, a field lens 90B, and a light modulation element 95B. In the third light source module 1B1 of the sixth embodiment, blue laser light B emitted from the pickup optical system 40 is collimated until it is incident on the first lens array 50. The despeckle element 209 and the first lens array 50 are arranged spaced apart from each other in an optical path of blue laser light B and DB. An optical axis AX1 from the light source unit 10 to the despeckle element 209 extends in the Z direction. That is, the optical path of the blue laser light B and DB is curved such that the blue laser light B and DB is refracted to the X direction from the Z direction between the despeckle element 209 and the first lens array 50.

While the despeckle element 201 of the first embodiment is made of a transmissive metasurface element 211, the despeckle element 209 of the sixth embodiment is made of a reflective metasurface element 291. The metasurface element 291 will be described below.

Despeckle Element

Figure 24:
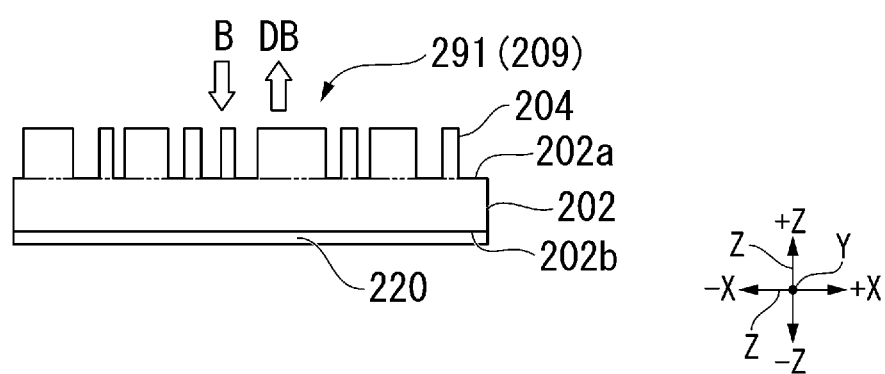
FIG. 24 is a side view of a metasurface element of a sixth embodiment.

FIG. 24 is a side view of the metasurface element 291 of the sixth embodiment. As shown in FIG. 24, the metasurface element 291 includes a substrate (a base material) 202 having plate surfaces 202a and 202b parallel to the XY plane including the X and Y directions, a plurality of microstructures 204 provided on the plate surface 202a, and a reflective film 220 provided on the plate surface 202b. The metasurface element 291 is configured similar to the metasurface element 211 and designed similar to the metasurface element 211 except that the plate surfaces 202a and 202b are parallel to the XY plane and the reflective film 220 is provided on the plate surface 202b.

The reflective film 220 is configured to be able to reflect at least the blue laser light B and is made of, for example, a metallic reflective film formed of aluminum (Al) or the like or a dielectric multilayer film designed according to the peak wavelength of the blue laser light B.

The metasurface element 291 of the sixth embodiment described above includes the substrate 202 and at least one microstructure 204 arranged on the plate surface 202b of the substrate 202. Features of the metasurface element 291 of the sixth embodiment that are common with the metasurface element 211 of the first embodiment have operational effects similar to those of the metasurface element 211.

In the metasurface element 291 of the sixth embodiment, the reflective film 220 is provided on the plate surface (the surface opposite to the reference surface) 202b opposite to the plate surface 202a of the substrate 202. As a result, the blue laser light B incident on the metasurface element 291 from the +Z side in the Z direction is despeckled by sequentially passing through the microstructures 204 and the substrate 202 and is then reflected by the reflective film 220 and further despeckled by sequentially passing through the substrate 202 and the microstructures 204. Thus, according to the metasurface element 291 of the sixth embodiment, it is possible to increase the range of the amount of phase modulation $\phi_B$ that depends on the height t1, compared to the configuration in which the reflective film 220 is not formed on the plate surface 202b of the substrate 202 as in the metasurface element 211. That is, it is possible to achieve an amount of phase modulation ($2 \times \phi_B$) that is twice the amount of phase modulation $\phi_B$ achieved by the plurality of microstructures 204 of the metasurface element 291.

According to the metasurface element 291 of the sixth embodiment, the height t1 of the microstructures 204 formed on the plate surface 202a of the substrate 202 can be reduced below a height corresponding to the amount of phase modulation $\phi_B$ required for the metasurface element 291, specifically, down to a height corresponding to half the amount of phase modulation $\phi_B$ required for the metasurface element 291 ($\phi_B/2$). This can reduce the difficulty of manufacturing the metasurface element 291 of the sixth embodiment, compared to the difficulty of manufacturing the metasurface element 211 of the first embodiment.

Although the preferred embodiments of the present disclosure have been described in detail above, the present disclosure is not limited to such specific embodiments and various modifications and changes can be made without departing from the spirit of the present disclosure described in the claims. The constituent elements of multiple embodiments can be combined as appropriate.

For example, the metasurface element of the present disclosure including the metasurface elements of the above embodiments and modifications thereof can be appropriately disposed at such a position that the despeckling effect is effectively exhibited in the image forming region of the light modulation element that forms image light in the light source module or a suitable position according to a function implemented by the metasurface element. For example, the metasurface element of the present disclosure having only a function of despeckling the blue laser light B may be disposed at the position PS1, which is in a region close to the light source unit 10 of the third light source module 1B or the white light source module 1W described above and is in front of the microlenses 14 which are on the front side of the light source unit 10 in the traveling direction of the blue laser light B, or the position PS2 substantially equal to the position of the second lens array 60 in the optical path of the blue laser light B.

The metasurface element of the present disclosure including the metasurface elements of the above embodiments and modifications thereof is applicable not only to a projector but also to any image processing device as long as it has an image forming region where an image for a screen which is to be formed on the retina of an observer is formed.

A projector according to aspects of the present disclosure may have the following configurations.

A projector of an aspect of the present disclosure includes a light source, a metasurface element configured to modulate a phase of light emitted from the light source, and a light modulation element configured to modulate the phase-modulated light emitted from the metasurface element to generate image light.

In the projector of the aspect of the present disclosure, the metasurface element may be disposed at a position that is conjugate to an image forming region of the light modulation element.

In the projector of the aspect of the present disclosure, the metasurface element may include a base material having a first reference surface and a microstructure that is arranged on the first reference surface and has a width in a direction along the first reference surface and a height in a direction crossing the first reference surface, and at least one of the height and the width may be set according to an amount of phase modulation of the light passing through the microstructure.

In the projector of the aspect of the present disclosure, the base material may have a second reference surface parallel to the first reference surface and include a reflective film disposed on the second reference surface.

In the projector of the aspect of the present disclosure, the base material may have a second reference surface parallel to the first reference surface and include a microstructure that is arranged on the second reference surface and has a width in a direction along the second reference surface and a height in a direction crossing the second reference surface, and at least one of the height and the width may be set according to an amount of phase modulation of the light passing through the microstructure.

In the projector of the aspect of the present disclosure, the microstructure arranged on the first reference surface and the microstructure arranged on the second reference surface may be aligned with each other in a direction parallel to the first reference surface and the second reference surface.

In the projector of the aspect of the present disclosure, the metasurface element may include a first metasurface portion and a second metasurface portion, each of the first metasurface portion and the second metasurface portion may include a base material having a first reference surface and a microstructure that is arranged on the first reference surface and has a width in a direction along the first reference surface and a height in a direction crossing the first reference surface, and at least one of the height and the width may be set according to an amount of phase modulation of the light passing through the microstructure.

In the projector of the aspect of the present disclosure, the at least one of the height and the width may be determined such that the amount of phase modulation of the light passing through the microstructure is within a range of 0 to $2\pi$.

In the projector of the aspect of the present disclosure, the at least one of the height and the width may be determined such that the light passing through the microstructure is randomly phase-modulated and light having a second wavelength different from a first wavelength of the light passing through the microstructure is focused.

In the projector of the aspect of the present disclosure, the at least one of the height and the width may be determined such that the light passing through the microstructure is randomly phase-modulated and a light intensity of light having a second wavelength different from a first wavelength of the light passing through the microstructure is reduced when emitted from the metasurface element compared to when incident on the metasurface element.

In the projector of the aspect of the present disclosure, the metasurface element may be divided into a plurality of regions arranged in a radial direction of the first reference surface, and a maximum amount of phase modulation of the light passing through a microstructure disposed on the first reference surface in a first of two regions adjacent to each other in the radial direction, the first being a radially outer region, may be smaller than a maximum amount of phase modulation of the light passing through a microstructure arranged on the first reference surface in a second of the two regions, the second being a radially inner region.

In the projector of the aspect of the present disclosure, the at least one of the height and the width of the microstructure arranged on the first reference surface in the radially inner region may be determined such that an amount of phase modulation of the light passing through the microstructure is within a range of 0 to $2\pi$.

In the projector of the aspect of the present disclosure, the microstructure may be formed of a material that contracts or expands with changes in temperature.

In the projector of the aspect of the present disclosure, the microstructure may be formed of a material with a phase that changes to an amorphous state or a crystalline state with changes in temperature.

A projector according to an aspect of the present disclosure may have the following configuration.

A projector of an aspect of the present disclosure includes a projection optical system configured to expand and project image light at a predetermined position.

What is claimed is:
1. A projector comprising:
a light source;
a metasurface element configured to modulate a phase of light emitted from the light source; and
a light modulation element configured to modulate the phase-modulated light emitted from the metasurface element to generate image light.

2. The projector according to claim 1, wherein the metasurface element is disposed at a position that is conjugate to an image forming region of the light modulation element.

3. The projector according to claim 1, wherein the metasurface element includes:
- a base material having a first reference surface; and
- a microstructure that is arranged at the first reference surface and has a width in a direction along the first reference surface and a height in a direction crossing the first reference surface, and
- at least one of the height and the width is set according to an amount of phase modulation of the light passing through the microstructure.

4. The projector according to claim 3, wherein the base material has a second reference surface parallel to the first reference surface and includes a reflective film disposed at the second reference surface.

5. The projector according to claim 4 wherein the microstructure arranged at the first reference surface and the microstructure arranged at the second reference surface are aligned with each other in a direction parallel to the first reference surface and the second reference surface.

6. The projector according to claim 3, wherein the base material has a second reference surface parallel to the first reference surface and includes a microstructure that is arranged at the second reference surface and has a width in a direction along the second reference surface and a height in a direction crossing the second reference surface, and
- at least one of the height and the width is set according to an amount of phase modulation of the light passing through the microstructure.

7. The projector according to claim 3, wherein the at least one of the height and the width is determined such that the amount of phase modulation of the light passing through the microstructure is within a range of 0 to $2\pi$.

8. The projector according to claim 3, wherein the at least one of the height and the width is determined such that the light passing through the microstructure is randomly phase-modulated and light having a second wavelength different from a first wavelength of the light passing through the microstructure is focused.

9. The projector according to claim 3, wherein the at least one of the height and the width is determined such that the light passing through the microstructure is randomly phase-modulated and a light intensity of light having a second wavelength different from a first wavelength of the light passing through the microstructure is reduced when emitted from the metasurface element compared to when incident on the metasurface element.

10. The projector according to claim 3, wherein the metasurface element is divided into a plurality of regions arranged in a radial direction of the first reference surface, and
- a maximum amount of phase modulation of the light passing through the microstructure disposed at the first reference surface in a first region of two regions adjacent to each other in the radial direction is smaller than a maximum amount of phase modulation of the light passing through the microstructure arranged at the first reference surface in a second region of the two regions, the first region being a radially outer region, and the second region being a radially inner region.

11. The projector according to claim 10, wherein the at least one of the height and the width of the microstructure arranged at the first reference surface in the radially inner region is determined such that an amount of phase modulation of the light passing through the microstructure is within a range of 0 to $2\pi$.

12. The projector according to claim 3, wherein the microstructure is formed of a material that contracts or expands with changes in temperature.

13. The projector according to claim 3, wherein the microstructure is formed of a material with a phase that changes to an amorphous state or a crystalline state with changes in temperature.

14. The projector according to claim 1, wherein the metasurface element includes a first metasurface portion and a second metasurface portion,
- each of the first metasurface portion and the second metasurface portion includes:
- a base material having a first reference surface; and
- a microstructure that is arranged at the first reference surface and has a width in a direction along the first reference surface and a height in a direction crossing the first reference surface, and
- at least one of the height and the width is set according to an amount of phase modulation of the light passing through the microstructure.

* * * * *